US012615484B2

(12) United States Patent (10) Patent No.: US 12,615,484 B2
Millington et al. (45) Date of Patent: Apr. 28, 2026

(54) NETWORK DEVICE FOR MEDIA PLAYBACK

(71) Applicant: Sonos, Inc., Santa Barbara, CA (US)

(72) Inventors: Nicholas A.J. Millington, Santa Barbara, CA (US); Craig Wisneski, Cambridge, MA (US); Steven Beckhardt, Cambridge, MA (US); Neil Griffiths, Lexington, MA (US)

(73) Assignee: Sonos, Inc., Goleta, CA (US)

( * ) Notice: Subject to any disclaimer, the term of this patent is extended or adjusted under 35 U.S.C. 154(b) by 0 days.

(21) Appl. No.: 18/438,657

(22) Filed: Feb. 12, 2024

(65) Prior Publication Data

US 2024/0187803 A1     Jun. 6, 2024

Related U.S. Application Data

(63) Continuation of application No. 17/532,548, filed on Nov. 22, 2021, now Pat. No. 12,096,187, which is a
(Continued)

(51) Int. Cl.
*H04R 3/12* (2006.01)
*G06F 3/16* (2006.01)
(Continued)

(52) U.S. Cl.
CPC ............ *H04R 27/00* (2013.01); *G06F 3/165* (2013.01); *H03G 3/20* (2013.01); *H04L 12/282* (2013.01);
(Continued)

(58) Field of Classification Search
CPC .... H04R 27/00; H04R 3/12; H04R 2227/003; H04R 2227/005; H04R 2420/07
(Continued)

(56) References Cited

U.S. PATENT DOCUMENTS

| | | | |
|---|---|---|---|
| 5,440,644 | A | 8/1995 | Farinelli et al. |
| 5,745,583 | A | 4/1998 | Koizumi et al. |

(Continued)

FOREIGN PATENT DOCUMENTS

| | | | |
|---|---|---|---|
| CN | 101512458 | | 8/2009 |
| EP | 1389853 | A1 | 2/2004 |

(Continued)

OTHER PUBLICATIONS

Yamaha DME 64 Owner's Manual; copyright 2004, 80 pages.
(Continued)

*Primary Examiner* — Disler Paul
(74) *Attorney, Agent, or Firm* — Akerman LLP

(57) ABSTRACT

Disclosed embodiments include network devices and systems of network devices. Some network device embodiments include (i) first and second network interfaces, (ii) a processor(s), (iii) tangible, non-transitory computer-readable medium, and (iv) program instructions stored on the tangible, non-transitory computer-readable medium that are executable by the at least one processor. Execution of the program instructions in some embodiments causes the network device to perform operations comprising (i) operating as part of a group with at least a second network device, (ii) receiving, via the first network interface, a message from a third network device, (iii) obtaining media content based on the message, (iv) transmit, via the second network interface, audio associated with the obtained media content to the second network device, and (v) causing video associated with the obtained media content to be output while the second network device outputs audio associated with the obtained media content.

28 Claims, 13 Drawing Sheets

Related U.S. Application Data continuation of application No. 16/174,245, filed on Oct. 29, 2018, now Pat. No. 11,184,721, which is a continuation of application No. 15/489,918, filed on Apr. 18, 2017, now Pat. No. 10,117,034, which is a continuation of application No. 14/570,869, filed on Dec. 15, 2014, now Pat. No. 9,681,232, which is a continuation of application No. 13/274,059, filed on Oct. 14, 2011, now Pat. No. 8,971,546.

(51) Int. Cl.

| | |
|---|---|
| *H03G 3/20* | (2006.01) |
| *H04L 12/28* | (2006.01) |
| *H04R 27/00* | (2006.01) |
| *H03G 3/00* | (2006.01) |

(52) U.S. Cl.
CPC ............... *H04R 3/12* (2013.01); *H03G 3/001* (2013.01); *H04L 2012/2849* (2013.01); *H04R 2227/003* (2013.01); *H04R 2227/005* (2013.01); *H04R 2420/07* (2013.01); *H04R 2430/01* (2013.01)

(58) Field of Classification Search
USPC ............................... 381/104–109, 77, 79, 80
See application file for complete search history.

(56) References Cited

U.S. PATENT DOCUMENTS

| | | | |
|---|---|---|---|
| 5,761,320 | A | 6/1998 | Farinelli et al. |
| 5,883,963 | A | 3/1999 | Tonella |
| 5,923,902 | A | 7/1999 | Inagaki |
| 6,032,202 | A | 2/2000 | Lea et al. |
| 6,256,554 | B1 | 7/2001 | DiLorenzo |
| 6,404,811 | B1 | 6/2002 | Cvetko et al. |
| 6,469,633 | B1 | 10/2002 | Wachter |
| 6,522,886 | B1 | 2/2003 | Youngs et al. |
| 6,611,537 | B1 | 8/2003 | Edens et al. |
| 6,631,410 | B1 | 10/2003 | Kowalski et al. |
| 6,757,517 | B2 | 6/2004 | Chang |
| 6,778,869 | B2 | 8/2004 | Champion |
| 7,130,608 | B2 | 10/2006 | Hollstrom et al. |
| 7,130,616 | B2 | 10/2006 | Janik |
| 7,143,939 | B2 | 12/2006 | Henzerling |
| 7,236,773 | B2 | 6/2007 | Thomas |
| 7,295,548 | B2 | 11/2007 | Blank et al. |
| 7,391,791 | B2 | 6/2008 | Balassanian et al. |
| 7,415,119 | B2 | 8/2008 | Boss et al. |
| 7,483,538 | B2 | 1/2009 | McCarty et al. |
| 7,571,014 | B1 | 8/2009 | Lambourne et al. |
| 7,630,501 | B2 | 12/2009 | Blank et al. |
| 7,643,894 | B2 | 1/2010 | Braithwaite et al. |
| 7,653,203 | B2 | 1/2010 | Holmi et al. |
| 7,657,910 | B1 | 2/2010 | McAulay et al. |
| 7,792,311 | B1 | 9/2010 | Holmgren et al. |
| 7,853,341 | B2 | 12/2010 | McCarty et al. |
| 7,987,294 | B2 * | 7/2011 | Bryce ...................... H04R 3/12 |
| | | | 709/248 |
| 8,014,423 | B2 | 9/2011 | Thaler et al. |
| 8,045,952 | B2 | 10/2011 | Qureshey et al. |
| 8,103,009 | B2 | 1/2012 | McCarty et al. |
| 8,111,837 | B2 * | 2/2012 | Guetta ................ H04M 1/6016 |
| | | | 381/80 |
| 8,234,395 | B2 | 7/2012 | Millington |
| 8,290,603 | B1 | 10/2012 | Lambourne |
| 8,364,296 | B2 | 1/2013 | Wilhelm |
| 8,442,239 | B2 | 5/2013 | Bruelle-Drews et al. |
| 8,483,853 | B1 | 7/2013 | Lambourne |
| 8,938,312 | B2 | 1/2015 | Millington et al. |
| 8,942,252 | B2 | 1/2015 | Balassanian et al. |
| 9,078,072 | B2 * | 7/2015 | Sundaresan .......... H04L 43/062 |
| 9,137,602 | B2 | 9/2015 | Mayman et al. |
| 9,282,417 | B2 | 3/2016 | Harma et al. |

| | | | |
|---|---|---|---|
| 9,544,689 | B2 * | 1/2017 | Fisher .................... G06F 3/165 |
| 10,013,381 | B2 * | 7/2018 | Mayman .................. H04R 3/12 |
| 10,298,291 | B2 | 5/2019 | McCarty et al. |
| 2001/0042107 | A1 | 11/2001 | Palm |
| 2002/0022453 | A1 | 2/2002 | Balog et al. |
| 2002/0026442 | A1 | 2/2002 | Lipscomb et al. |
| 2002/0124097 | A1 | 9/2002 | Isely et al. |
| 2003/0157951 | A1 | 8/2003 | Hasty, Jr. |
| 2004/0024478 | A1 | 2/2004 | Hans et al. |
| 2004/0128198 | A1 | 7/2004 | Register et al. |
| 2004/0215611 | A1 | 10/2004 | Jawa et al. |
| 2004/0247139 | A1 | 12/2004 | Wang |
| 2005/0152562 | A1 | 7/2005 | Holmi et al. |
| 2005/0190145 | A1 | 9/2005 | Hlasny et al. |
| 2005/0271219 | A1 | 12/2005 | Bruelle-Drews et al. |
| 2006/0089735 | A1 | 4/2006 | Atkinson |
| 2006/0168340 | A1 | 7/2006 | Heller et al. |
| 2006/0222186 | A1 | 10/2006 | Paige et al. |
| 2007/0060054 | A1 | 3/2007 | Romesburg |
| 2007/0142944 | A1 | 6/2007 | Goldberg et al. |
| 2008/0069319 | A1 | 3/2008 | Igoe |
| 2008/0075295 | A1 | 3/2008 | Mayman et al. |
| 2008/0085015 | A1 | 4/2008 | Chen |
| 2008/0118086 | A1 | 5/2008 | Krig |
| 2008/0215169 | A1 | 9/2008 | Debettencourt et al. |
| 2009/0005892 | A1 | 1/2009 | Guetta et al. |
| 2009/0051824 | A1 | 2/2009 | Satou |
| 2009/0190778 | A1 | 7/2009 | Delia et al. |
| 2009/0232326 | A1 | 9/2009 | Gordon et al. |
| 2009/0251604 | A1 | 10/2009 | Iyer |
| 2009/0262256 | A1 | 10/2009 | Asayama et al. |
| 2009/0318085 | A1 * | 12/2009 | Seshadri ............. H04M 1/6066 |
| | | | 455/41.3 |
| 2010/0142723 | A1 | 6/2010 | Bucklen |
| 2010/0313133 | A1 | 12/2010 | Green et al. |
| 2010/0323621 | A1 | 12/2010 | Slamka et al. |
| 2010/0324891 | A1 | 12/2010 | Cutler |
| 2011/0216914 | A1 | 9/2011 | Mccarty et al. |
| 2011/0228944 | A1 | 9/2011 | Croghan et al. |
| 2011/0292299 | A1 * | 12/2011 | Lau ....................... G06F 3/0488 |
| | | | 725/39 |
| 2011/0299696 | A1 | 12/2011 | Holmgren et al. |
| 2012/0051560 | A1 | 3/2012 | Sanders |
| 2012/0099732 | A1 | 4/2012 | Visser |
| 2012/0263318 | A1 | 10/2012 | Millington et al. |
| 2012/0328109 | A1 | 12/2012 | Harma et al. |
| 2013/0336498 | A1 * | 12/2013 | Haatainen ............. H04J 3/0667 |
| | | | 381/80 |
| 2014/0230015 | A1 | 8/2014 | Pollock |
| 2014/0256260 | A1 | 9/2014 | Ueda et al. |
| 2015/0100143 | A1 | 4/2015 | Gao et al. |
| 2015/0380010 | A1 | 12/2015 | Srinivasan |
| 2016/0157008 | A1 | 6/2016 | Zhang et al. |

FOREIGN PATENT DOCUMENTS

| | | | | |
|---|---|---|---|---|
| EP | 2498515 | A2 * | 9/2012 | ............. H04H 20/71 |
| JP | 2007288706 | | 11/2007 | |
| JP | 2009159477 | A | 7/2009 | |
| JP | 2010282603 | | 12/2010 | |
| WO | 200153994 | | 7/2001 | |
| WO | 2003093950 | A2 | 11/2003 | |
| WO | 2007037208 | A1 | 4/2007 | |
| WO | 2008027894 | | 3/2008 | |
| WO | 2008069304 | A1 | 6/2008 | |

OTHER PUBLICATIONS

Yamaha DME Designer 3.5 setup manual guide; copyright 2004, 16 pages.
Yamaha DME Designer 3.5 User Manual; Copyright 2004, 507 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.

(56) References Cited

OTHER PUBLICATIONS

Bluetooth. "Specification of the Bluetooth System: The ad hoc Scatternet for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Chinese Patent Office, First Office Action mailed on Aug. 3, 2016, issued in connection with Chinese Application No. 20120061765.5, 6 pages.
Chinese Patent Office, First Office Action mailed on Dec. 3, 2015, issued in connection with Chinese Application No. CN201280061765. 5, 16 pages.
Chinese Patent Office, Third Office Action mailed on Nov. 2, 2016, issued in connection with Chinese Application No. 20120061765.5, 7 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
European Patent Office, European Extended Search Report mailed on Feb. 12, 2019, issued in connection with European Application No. 18210533.8, 7 pages.
European Patent Office, European Extended Search Report mailed on Apr. 7, 2021, issued in connection with European Application No. 20210879.1, 7 pages.
European Patent Office, European Office Action mailed on Jan. 22, 2020, issued in connection with European Application No. 18210533. 8, 4 pages.
European Patent Office, European Search Report mailed on Sep. 7, 2023, issued in connection with European Application No. 23186585. 8, 7 pages.
European Patent Office,Extended European Search Report mailed on May 29, 2015, issued in connection with European Patent Application No. 12839986.2, 5 pages.
Final Office Action mailed on Apr. 16, 2014, issued in connection with U.S. Appl. No. 13/274,059, filed Oct. 14, 2011, 17 pages.
Final Office Action mailed on May 26, 2021, issued in connection with U.S. Appl. No. 16/174,245, filed Oct. 29, 2018, 19 pages.
Final Office Action mailed on Jul. 3, 2023, issued in connection with U.S. Appl. No. 17/532,548, filed Nov. 22, 2021, 24 pages.
Final Office Action mailed on Aug. 30, 2019, issued in connection with U.S. Appl. No. 16/174,245, filed Oct. 29, 2018, 18 pages.
International Bureau, International Preliminary Report onPatentability, mailed on Apr. 24, 2014, issued in connection with InternationalApplication No. PCT/US2012/059304, filed on Oct. 9, 2012, 8 pages.
International Searching Authority, International Search Report and Written Opinion mailed on Jan. 29, 2013, issued in connection with International Application No. PCT/US2012/059304, filed on Oct. 9, 2012, 12 pages.
Japanese Patent Office, Decision of Rejection mailed on Apr. 5, 2016, issued in connection with Japanese Patent Application No. JP2014-535781, 8 pages.
Japanese Patent Office, Office Action mailed on Jun. 6, 2017, issued in connection with Japanese Patent Application No. 2016-152952, 6 pages.
Japanese Patent Office, Translation of Office Action mailed on Jun. 6, 2017, issued in connection with Japanese Patent Application No. 2016-152952, 3 pages.
Japanese Patent Office,Notice of Rejection mailed on Jun. 9, 2015, issued in connection with Japanese Patent Application No. 2014-535781, 9 pages.
Jo et al., "Synchronized One-to-many Media Streaming with Adaptive Playout Control," Proceedings of SPIE, 2002, pp. 71-82, vol. 4861.

Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Non-Final Action mailed on Aug. 18, 2014, issued in connection with U.S. Appl. No. 13/274,059, filed Oct. 14, 2011, 14 pages.
Non-Final Office Action mailed on Feb. 11, 2020, issued in connection with U.S. Appl. No. 16/174,245, filed Oct. 29, 2018, 20 pages.
Non-Final Office Action mailed on Sep. 14, 2020, issued in connection with U.S. Appl. No. 16/174,245, filed Oct. 29, 2018, 18 pages.
Non-Final Office Action mailed on Apr. 15, 2016, issued in connection with U.S. Appl. No. 14/570,869, filed Dec. 15, 2015, 14 pages.
Non-Final Office Action mailed on Aug. 19, 2016, issued in connection with U.S. Appl. No. 14/570,869, filed Dec. 15, 2014, 18 pages.
Non-Final Office Action mailed on Dec. 19, 2023, issued in connection with U.S. Appl. No. 17/532,548, filed Nov. 22, 2021, 8 pages.
Non-Final Office Action mailed on May 20, 2019, issued in connection with U.S. Appl. No. 16/174,245, filed Oct. 29, 2018, 13 pages.
Non-Final Office Action mailed on Jun. 21, 2017, issued in connection with U.S. Appl. No. 15/489,918, filed Apr. 18, 2017, 14 pages.
Non-Final Office Action mailed on Jan. 24, 2023, issued in connection with U.S. Appl. No. 17/532,548, filed Nov. 22, 2021, 23 pages.
Non-Final Office Action mailed on Dec. 30, 2013, issued in connection with U.S. Appl. No. 13/274,059, filed Oct. 14, 2011, 17 pages.
Non-Final Office Action mailed on Dec. 4, 2017, issued in connection with U.S. Appl. No. 15/489,918, filed Apr. 18, 2017, 16 pages.
Notice of Allowance mailed on Dec. 5, 2014, issued in connection with U.S. Appl. No. 13/274,059, filed Oct. 14, 2011, 8 pages.
Notice of Allowance mailed on Dec. 15, 2016, issued in connection with U.S. Appl. No. 14/570,869, filed Dec. 15, 2014, 9 pages.
Notice of Allowance mailed on Aug. 2, 2018, issued in connection with U.S. Appl. No. 15/489,918, filed Apr. 18, 2017, 12 pages.
Notice of Allowance mailed on Sep. 22, 2021, issued in connection with U.S. Appl. No. 16/174,245, filed Oct. 29, 2018, 9 pages.
Notice of Allowance mailed on Mar. 30, 2017, issued in connection with U.S. Appl. No. 14/570,869, filed Dec. 15, 2014, 9 pages.
Palm, Inc., "Handbook for the Palm VII Handheld," May 2000, 311 pages.
Presentations at WinHEC 2000, May 2000, 138 pages.
U.S. Appl. No. 60/490,768, filed Jul. 28, 2003, entitled "Method for synchronizing audio playback between multiple networked devices," 13 pages.
U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
European Patent Office, European EPC Article 94.3 mailed on Aug. 28, 2024, issued in connection with European Application No. 24162261.2, 4 pages.
European Patent Office, European EPC Article 94.3 mailed on Jan. 30, 2025, issued in connection with European Application No. 24162261.2, 4 pages.
European Patent Office, European Extended Search Report mailed on May 7, 2024, issued in connection with European Application No. 24162261.2, 6 pages.

* cited by examiner

200

208

210

202

210

900 ⟍

1000 ⟍

1100 ⟍

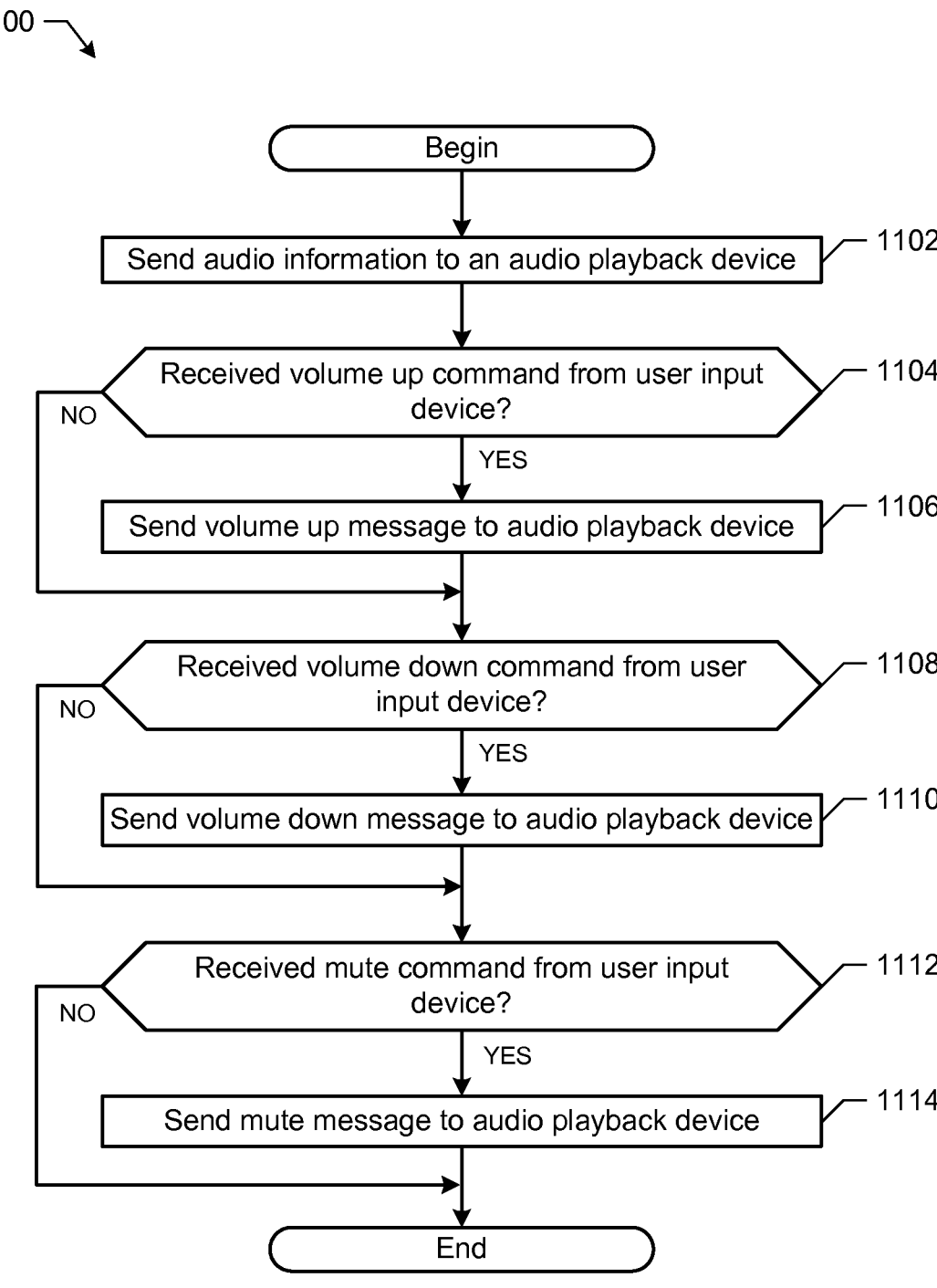

Begin

Send audio information to an audio playback device ⟍ 1102

Received volume up command from user input device? ⟍ 1104
NO

YES

Send volume up message to audio playback device ⟍ 1106

Received volume down command from user input device? ⟍ 1108
NO

YES

Send volume down message to audio playback device ⟍ 1110

Received mute command from user input device? ⟍ 1112
NO

YES

Send mute message to audio playback device ⟍ 1114

End

FIGURE 11

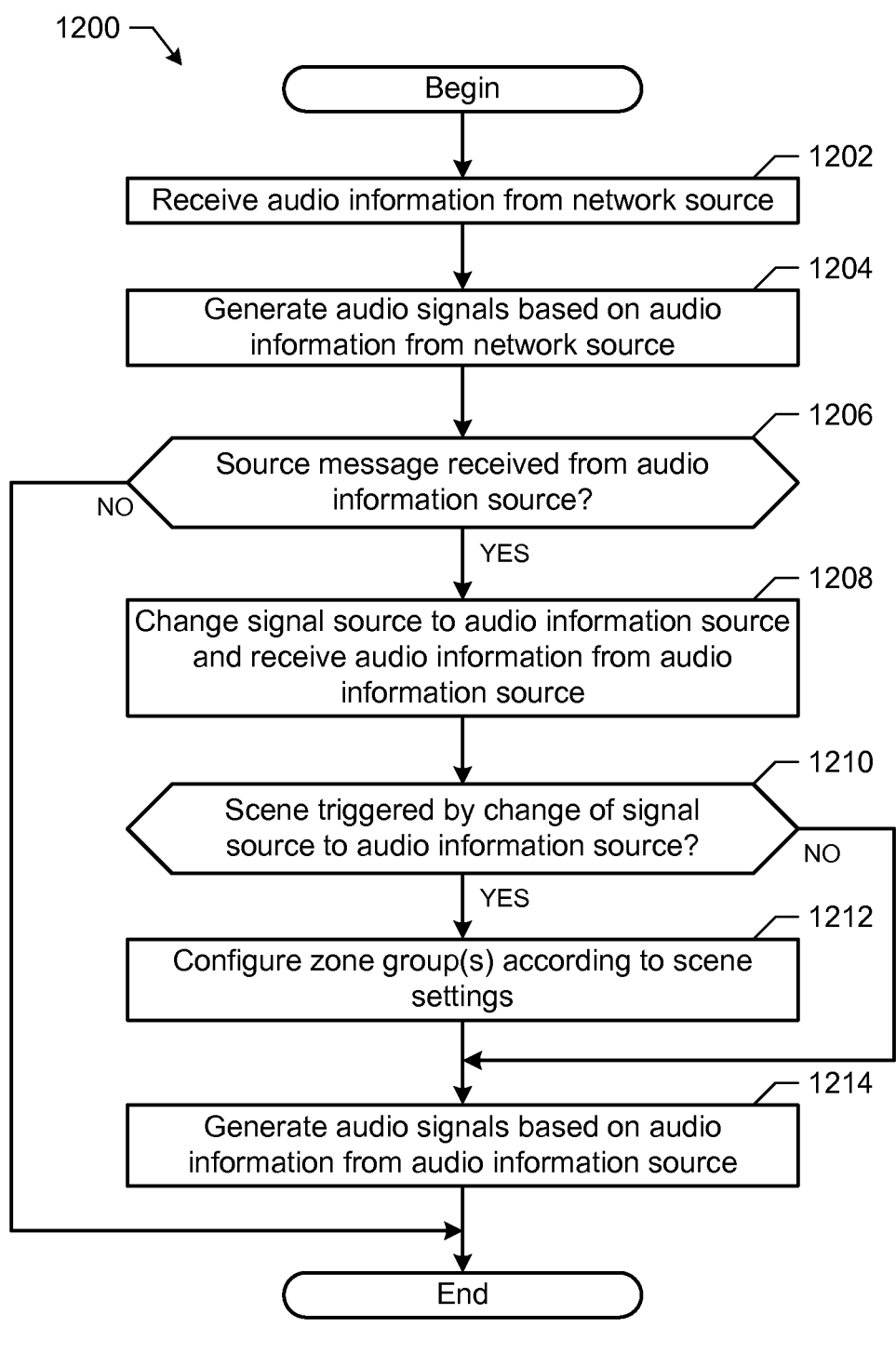

1200

Begin

Receive audio information from network source  — 1202

Generate audio signals based on audio information from network source  — 1204

Source message received from audio information source?  — 1206

NO

YES

Change signal source to audio information source and receive audio information from audio information source  — 1208

Scene triggered by change of signal source to audio information source?  — 1210

NO

YES

Configure zone group(s) according to scene settings  — 1212

Generate audio signals based on audio information from audio information source  — 1214

End

FIGURE 12

Ungrouped – Playing Music

1502

1504

Change to TV Audio

Ungrouped – Playing TV Audio

Change to TV Audio

1506

Grouped – Playing Music

1508

Grouped – Playing TV Audio

Group Zones for TV Audio - Off

Change to TV Audio

Group Zones for TV Audio - On

NETWORK DEVICE FOR MEDIA PLAYBACK

CROSS-REFERENCE TO RELATED APPLICATIONS

The present application is a continuation of U.S. application Ser. No. 17/532,548 titled "Playback Device Control," filed on Nov. 22, 2021, and currently pending; U.S. application Ser. No. 17/532,548 is a continuation of U.S. application Ser. No. 16/174,245 titled "Playback Device Control," filed Oct. 29, 2018, and issued as U.S. Pat. No. 11,184,721 on Nov. 23, 2021; U.S. application Ser. No. 16/174,245 is a continuation of U.S. application Ser. No. 15/489,918 titled "Leaving Group Based on Message From Audio Source," filed on Apr. 18, 2017, and issued as U.S. Pat. No. 10,117,034, on Oct. 30, 2018; U.S. application Ser. No. 15/489,918 is a continuation of U.S. application Ser. No. 14/570,869 titled "Control of Multiple Playback Devices," filed on Dec. 15, 2014, and issued as U.S. Pat. No. 9,681,232 on Jun. 13, 2017; and U.S. application Ser. No. 14/570,869 is a continuation of U.S. application Ser. No. 13/274,059 titled "Systems, Methods, Apparatus, and Articles of Manufacture to Control Audio Playback Devices," filed on Oct. 14, 2011, and issued as U.S. Pat. No. 8,971,546 on Mar. 3, 2015. The entire contents of U.S. application Ser. Nos. 17/532,548; 16/174,245; 15/489,918; 14/570,869; and 13/274,059 are incorporated herein by reference.

FIELD OF THE DISCLOSURE

The disclosure is related to consumer electronics and, more particularly, to antenna configurations for wireless speakers.

BACKGROUND

Technological advancements have increased the accessibility of music content, as well as other types of media, such as television content, movies, and interactive content. For example, a user can access audio, video, or both audio and video content over the Internet through an online store, an Internet radio station, an online music service, an online movie service, and the like, in addition to the more traditional avenues of accessing audio and video content. Demand for such audio and video content continues to surge. Given the high demand, technology used to access and play such content has likewise improved.

BRIEF DESCRIPTION OF THE DRAWINGS

Features, aspects, and advantages of the presently disclosed technology are better understood with regard to the following description, appended claims, and accompanying drawings where:

FIG. 11 shows a flowchart representative of an example method to control a volume setting of an audio playback device;

FIG. 12 shows a flowchart representative of an example method to control an audio playback device;

Figure 1:
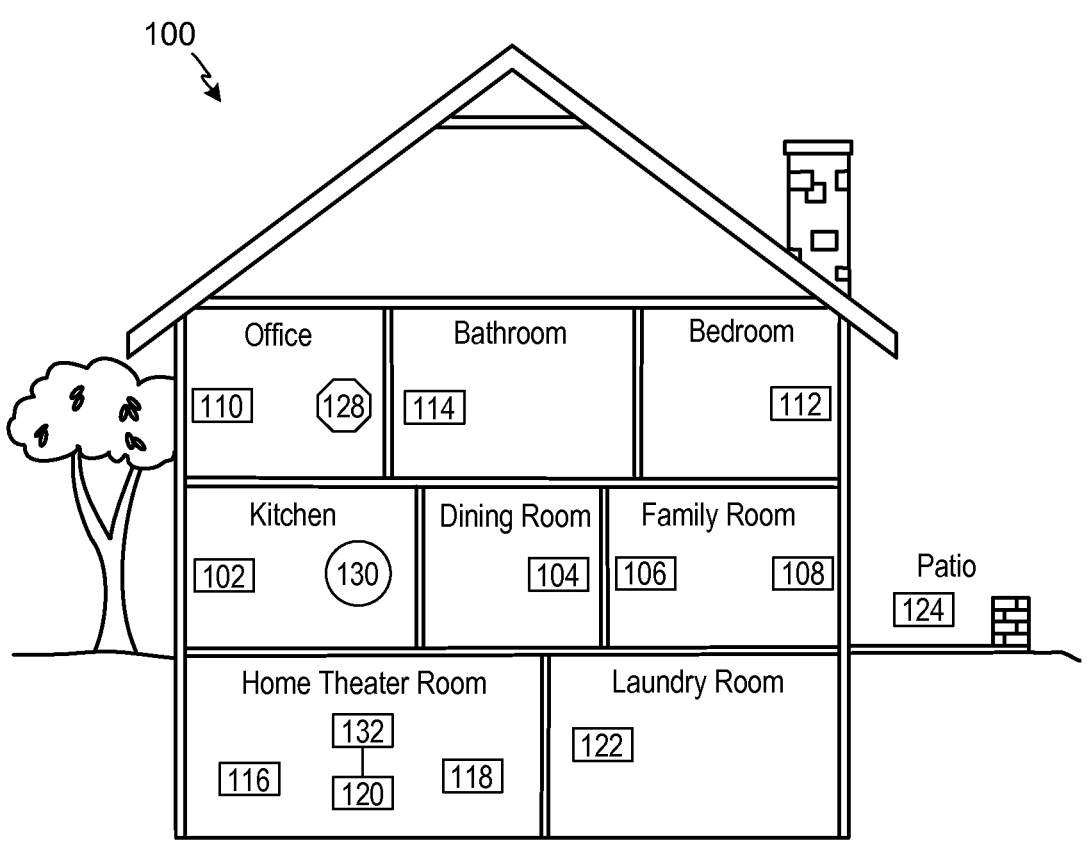
FIG. 1 shows an illustration of an example system in which embodiments of the methods and apparatus disclosed herein can be implemented.

In addition, the drawings are for the purpose of illustrating example embodiments, but it is understood that the present disclosure is not limited to the arrangements and instrumentality shown in the drawings.

DETAILED DESCRIPTION

I. Overview

Media presentation systems include presentation devices, such as displays and/or speakers, to receive content and to generate one or more outputs using the received content. Presentation devices can receive signals representative of the content in a plurality of manners using different techniques and/or technology. In some examples, audio content such as music or the audio portion of audio/video content is encoded onto a carrier signal that is then wirelessly transmitted from one or more sources to one or more wireless playback devices or speakers.

Example systems, methods, apparatus, and articles of manufacture disclosed herein provide for a simple control method of an audio playback device connected to multiple audio information sources. In some embodiments, an audio information source and the audio playback device exchange messages to control settings such as volume and selected signal source. In some such embodiments, audio information source and the audio playback device exchange messages to enable a user to interact with each of the audio information source and the audio playback device using respective dedicated user input devices. For example, the user can use a user input device associated with the audio playback device to change a signal source from the audio information source to another source of audio information. The audio playback device transmits messages to the audio information source to cause the audio information source to adjust one or more settings to comport with the source commands issued by the user. The user can also use a user input device associated with the audio information source to adjust a volume setting. The audio information source transmits commands to the audio playback device to cause the audio playback device to adjust a volume setting to comport with the volume command issued by the user.

Embodiments of the systems, methods, apparatus, and articles of manufacture disclosed herein provide control for audio playback devices. As described in greater detail below, the systems, methods, apparatus, and articles of manufacture disclosed herein provide users of an audio playback device with a control method using different user input devices. In an example of operation, an audio playback device is connected to an audio information source such as a television via a packet-based connection. A user is provided with a first user input device for the audio playback device and a second user input device for the television. In the example, the television begins in an off state. The user turns on the television using the television user input device, and the television responds by powering on and sending a command to the audio playback device to change a selected signal source to the television and begin playing audio information provided by the television (e.g., via the packet-based connection). The user can raise the audio volume, lower the audio volume, mute the audio, and/or unmute the audio using the user input device for the audio playback device and/or using the television user input device. In the case of changing the volume or muting the audio using the television user input device, the television sends a corresponding volume command to the example audio playback device to change the volume of the audio, mute the audio, or unmute the audio.

Continuing with the example, the user decides to listen to different audio, such as an Internet-based radio station. To accomplish this, the user uses the user input device for the audio playback device to select the desired audio information source (e.g., the Internet-based radio station). The audio playback device begins playing audio from the selected audio information source, and sends a volume command to the television to cause the television to change to a muted setting. At this time, the television can still display the video portion of the television signal, but does not output audio due to the muted setting of the television. The user can further change the volume setting, mute the audio, and/or unmute the audio being played via the user input device for the audio playback device. When the user desires to change back to listening to the audio associated with the television, the user can use the television user input device to change the volume and/or unmute the audio. The television responds to the command from the television user input device by changing to an unmuted setting and sending a source message to the audio playback device to change a signal source to the television. The audio playback device then uses the television as the audio information source and begins playing the audio from the television. In this manner, example systems, methods, apparatus, and articles of manufacture provide a control scheme for the audio playback device (e.g., in a home theater system) that is simple to use from a user perspective.

An example embodiment of an audio playback device implemented in accordance with the present disclosure includes an audio output device to generate audio signals based on a signal source, a device interface to receive a first message from a first audio information source, and a source selector to change the signal source from a second audio information source to the first audio information source based on the first message. In some embodiments, the playback device also includes a user input interface to receive a first command from a user input device. The device interface is to send a second message to the first audio information source based on the command. In some such embodiments, the source selector changes the signal source from the first audio information source to the second audio information source in response to the command, and the second message includes a mute command.

In some embodiments, the device interface receives a second message from the first audio information source when the signal source is the first audio information source. The second message is to be based on a command from a user input device configured to communicate with the first audio information source and includes a volume command and the audio output device changes a volume of the audio signals based on the second message.

In some embodiments, the device interface sends a third message to at least one additional playback device based on the second message.

In some embodiments, the first message is based on a command from a user input device configured to communicate with the first audio information source. In some such embodiments, the command is at least one of a power-on command or a volume command In some embodiments, the device interface communicates with the first audio information source and the second audio information source via at least one of a wired network or a wireless network.

In some embodiments, the device interface sends audio information associated with the signal source to at least one additional playback device.

In some embodiments, the first audio information source is a television and the device interface communicates with the television via a packet-based connection.

In some embodiments, the second audio information source is a network-based source of digital audio information.

An example system implemented in accordance with the present disclosure includes a television and an audio output device in communication with the television. In some embodiments, the audio output device selectively receives first audio information from the television, generates first audio signals at a first volume setting based on the first audio information, receives a first message from the television based on a user input to the television, and generates second audio signals at a second volume setting different from the first volume setting based on the first audio information and based on the first message.

In some embodiments, the television generates the message based on the user input and the message includes a volume command.

In some embodiments, the television and the audio output device are coupled via a local area network and the message is a packet-based network message.

In some embodiments, the audio output device receives a command from a user input device configured to communicate with the audio output device, generates third audio signals based on second audio information from a network-based audio information source, and transmits a second message to the television. In some such embodiments, the television changes a volume setting based on the second message.

In some embodiments, the audio output device generates the third audio signals to have substantially the same volume immediately following a change in an audio information source from the television to the network-based audio information source as the volume immediately preceding the change in the audio information source.

An example method implemented in accordance with the disclosure includes receiving first audio information from a first audio source, generating first audio signals based on the first audio information via a playback device, receiving a first message from a second audio source, and generating second audio signals based on second audio information from the second audio source in response to receiving the first message.

In some embodiments, the method further includes receiving the second audio information via a packet-based message.

In some embodiments, the method further includes receiving a second message based on a command from a first user input device associated with the second audio source, and adjusting a volume setting of the playback device based on the second message.

In some embodiments, the method further includes receiving a source command from a first user input device associated with the playback device and transmitting a second message to the second audio source to cause the first audio source to adjust the audio information.

An example method implemented in accordance with the disclosure includes sending first audio information to a playback device via a network connection, receiving, via the network connection, a message from the playback device based on a user input to the playback device, and changing a volume setting based on the first message.

In some embodiments, changing the volume setting includes stopping sending the first audio information to the playback device. In some such embodiments, the method further includes receiving a command from a user input device, sending a second message to the playback device via the network connection, and resuming sending the first audio information to the playback device to cause the playback device to generate audio signals based on the first audio information. In some such embodiments, the method further includes receiving a command from a user input device and sending a message to the playback device via the network connection to cause the playback device to change a volume setting of the playback device.

An example article of manufacture implemented in accordance with the disclosure includes machine readable instructions which, when executed, cause a machine to at least receive first audio information from a first audio source, generate first audio signals based on the first audio information via a playback device, receive a first message from a second audio source, and generate second audio signals based on second audio information from the second audio source in response to receiving the first message.

In some embodiments, the instructions further cause the machine to at least receive the second audio information via a packet-based message.

In some embodiments, the instructions further cause the machine to at least receive a second message based on a command from a first user input device associated with the second audio source, and adjust a volume setting of the playback device based on the second message.

In some embodiments, the instructions further cause the machine to at least receive a source command from a first user input device associated with the playback device and transmit a second message to the second audio source to cause the first audio source to adjust the audio information.

An example article of manufacture implemented in accordance with the disclosure includes machine readable instructions which, when executed, cause a machine to at least send first audio information to a playback device via a network connection, receive, via the network connection, a message from the playback device based on a user input to the playback device, and change a volume setting based on the first message.

In some embodiments, changing the volume setting includes stopping sending the first audio information to the playback device. In some such embodiments, the instructions further cause the machine to at least receive a command from a user input device, send a second message to the playback device via the network connection, and resume sending the first audio information to the playback device to cause the playback device to generate audio signals based on the first audio information.

In some embodiments, the instructions further cause the machine to at least receive a command from a user input device and send a message to the playback device via the network connection to cause the playback device to change a volume setting of the playback device.

Although the following discloses example systems, methods, apparatus, and articles of manufacture including, among other components, firmware and/or software executed on hardware, it should be noted that such systems, methods, apparatus, and/or articles of manufacture are merely illustrative and should not be considered as limiting. For example, it is contemplated that any or all of these firmware, hardware, and/or software components could be embodied exclusively in hardware, exclusively in software, exclusively in firmware, or in any combination of hardware, software, and/or firmware. Accordingly, while the following describes example systems, methods, apparatus, and/or articles of manufacture, the examples provided are not the only way(s) to implement such systems, methods, apparatus, and/or articles of manufacture.

When any of the appended claims are read to cover a purely software and/or firmware implementation, at least one of the elements in at least one example is hereby expressly defined to include a tangible medium such as a memory, DVD, CD, Blu-ray, and so on, storing the software and/or firmware.

These embodiments and many additional embodiments are described more below. Further, the detailed description is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments.

Reference herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

II. Example Environment

Referring now to the drawings, in which like numerals can refer to like parts throughout the figures, FIG. 1 shows an example system configuration 100 in which one or more of the method and/or apparatus disclosed herein can be practiced or implemented. By way of illustration, the system configuration 100 represents a home with multiple zones. Each zone, for example, represents a different room or space, such as an office, bathroom, bedroom, kitchen, dining room, family room, home theater room, utility or laundry room, and patio. While not shown here, a single zone can cover more than one room or space. One or more of zone players 102-124 are shown in each respective zone. A zone player 102-124, also referred to as a playback device, multimedia unit, speaker, and so on, provides audio, video, and/or audiovisual output. A controller 130 (e.g., shown in the kitchen for purposes of illustration) provides control to the system configuration 100. The system configuration 100 illustrates an example whole house audio system, though it is understood that the technology described herein is not limited to its particular place of application or to an expansive system like a whole house audio system 100 of FIG. 1.

Figure 2A:
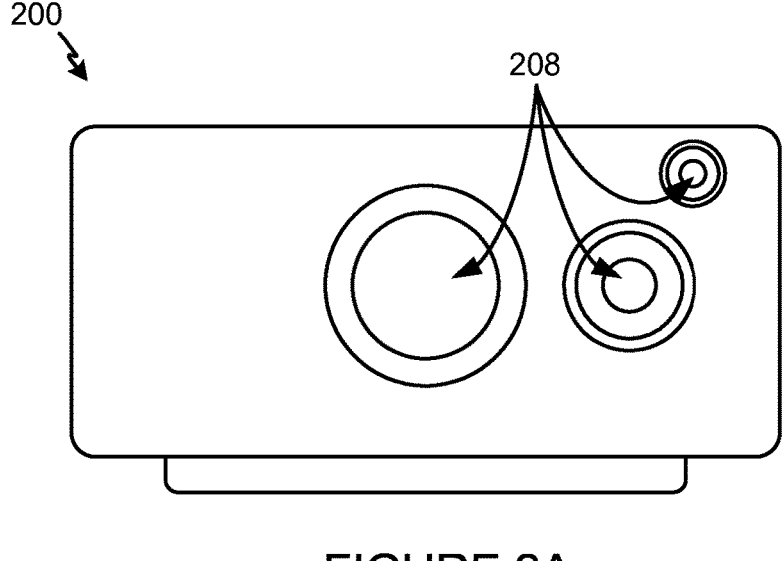
FIG. 2A shows an illustration of an example zone player having a built-in amplifier and speakers.
Figure 2B:
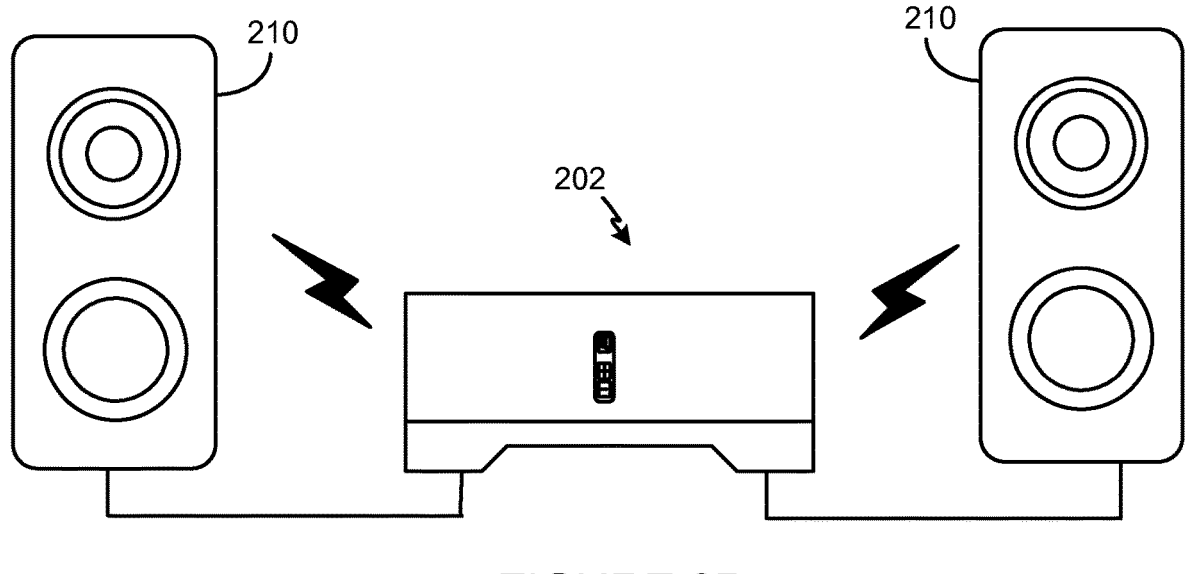
FIG. 2B shows an illustration of an example zone player having a built-in amplifier and connected to external speakers.
Figure 2C:
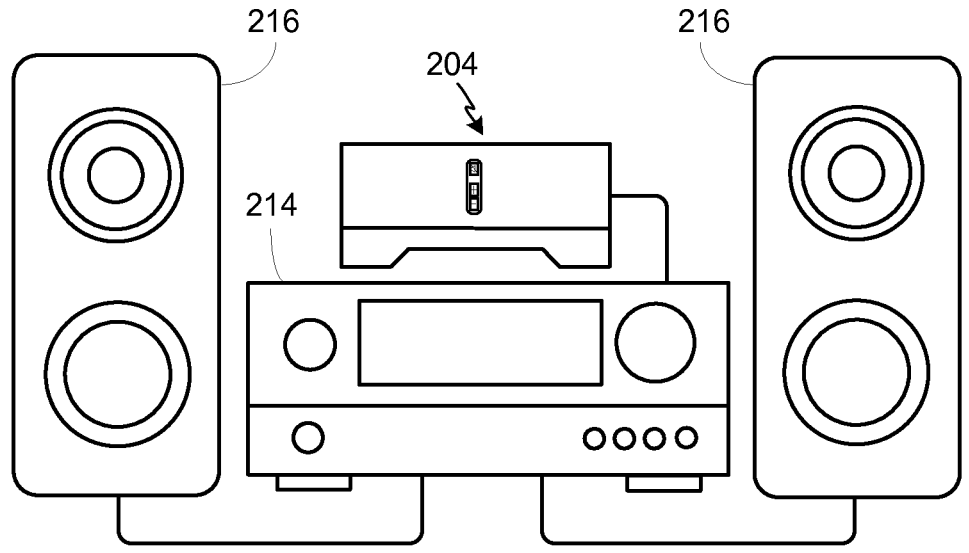
FIG. 2C shows an illustration of an example zone player connected to an A/V receiver and speakers.

FIGS. 2A, 2B, and 2C show example illustrations of zone players 200-204. The zone players 200-204 of FIGS. 2A, 2B, and 2C, respectively, can correspond to any of the zone players 102-124 of FIG. 1. While certain embodiments provide multiple zone players, an audio output can be generated using only a single zone player. FIG. 2A illustrates a zone player 200 including sound producing equipment 208 capable of generating sound or an audio output corresponding to a signal received (e.g., wirelessly and/or via a wired interface). The sound producing equipment 208 of the zone player 200 of FIG. 2A includes a built-in amplifier (not shown in this illustration) and speakers (e.g., a tweeter, a mid-range driver, and/or a subwoofer. In certain embodiments, the zone player 200 of FIG. 2A can be configured to play stereophonic audio or monaural audio. In some embodiments, the zone player 200 of FIG. 2A can be configured as a component in a combination of zone players to play stereophonic audio, monaural audio, and/or surround audio. As described in greater detail below, in some embodiments, the example zone player 200 of FIG. 2A can also transmit a second signal to, for example, other zone player (s) in the same or different zone(s), speaker(s), receiver(s), and so on. Transmission of the second signal can be part of, for example, a system in which multiple zone players, speakers, receivers, and so on, form a network to, for example, present media content in a synchronization or distributed manner.

The example zone player 202 of FIG. 2B includes a built-in amplifier (not shown in this illustration) to power a set of detached speakers 210. The speakers 210 of FIG. 2B can include, for example, any type of loudspeaker. The zone player 202 of FIG. 2B can communicate a signal corresponding to audio content to the detached speakers 210 via wired and/or wireless channels. Instead of receiving and generating audio content as in FIG. 2A, the zone player 202 of FIG. 2B receives the audio content and transmits the same (e.g., after processing the received signal) to the detached speakers 210. Similar to the example zone player 200 of FIG. 2A, in some embodiments the zone player 202 can transmit a second signal to, for example, other zone player (s) in the same or different zone(s), speaker(s), receiver(s), and so on.

The example zone player 204 of FIG. 2C does not include an amplifier, but allows a receiver 214, or another audio and/or video type device with built-in amplification, to connect to a data network 128 of FIG. 1 and to play audio received over the data network 128 via the receiver 214 and a set of detached speakers 216. In addition to the wired couplings shown in FIG. 2C, the detached speakers 216 can receive audio content via a wireless communication channel between the detached speakers 216 and, for example, the zone player 204 and/or the receiver 214. In some embodiments the zone player 202 can transmit a second signal to, for example, other zone player(s) in the same or different zone(s), speaker(s), receiver(s), and so on.

Example zone players include a "Sonos S5," "Sonos Play:5," "Sonos Play:3," "ZonePlayer 120," and "Zone-Player 90," which are offered by Sonos, Inc. of Santa Barbara, Calif. Any other past, present, and/or future zone players can additionally or alternatively be used to implement the zone players of example embodiments disclosed herein. A zone player can also be referred to herein as a playback device, and a zone player is not limited to the particular examples illustrated in FIGS. 2A, 2B, and 2C. For example, a zone player can include a wired or wireless headphone. In other examples, a zone player might include a subwoofer. In yet other examples, a zone player can include a sound bar. In an example, a zone player can include or interact with a docking station for an Apple iPod™ or similar device. In some embodiments, a zone player can relay one or more signals received from, for example, a first zone player to another playback device. In some embodiments, a zone player can receive a first signal and generate an output corresponding to the first signal and, simultaneously or separately, can receive a second signal and transmit or relay the second signal to another zone player(s), speaker(s), receiver(s), and so on. Thus, an example zone player described herein can act as a playback device and, at the same time, operate as a hub in a network of zone players. In such instances, media content corresponding to the first signal can be different from the media content corresponding to the second signal.

Figure 3:
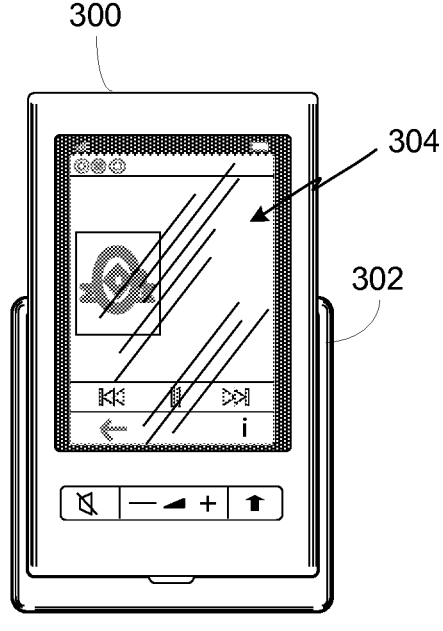
FIG. 3 shows an illustration of an example controller.

FIG. 3 shows an example illustration of a wireless controller 300 in a docking station 302. The controller 300 can correspond to the controlling device 130 of FIG. 1. The controller 300 is provided with a touch screen 304 that allows a user to interact with the controller 300, for example, to retrieve and navigate a playlist of audio items, control operations of one or more zone players, and provide overall control of the system configuration 100. In certain embodiments, any number of controllers can be used to control the system configuration 100. In certain embodiments, there can be a limit on the number of controllers that can control the system configuration 100. The controllers might be wireless like wireless controller 300 or wired to the data network 128. Furthermore, an application running on any network-enabled portable devices, such as an iPhone™, iPad™, Android™ powered phone, or any other smart phone or network-enabled device can be used as a controller by connecting to the data network 128. An application running on a laptop or desktop PC or Mac can also be used as a controller. Example controllers include a "Sonos® Controller 200," "Sonos® Controller for iPhone," "Sonos® Controller for iPad," "Sonos® Controller for Android, "Sonos® Controller for Mac or PC," which are offered by Sonos, Inc. of Santa Barbara, Calif. The flexibility of such an application and its ability to be ported to a new type of portable device is advantageous.

Referring back to the system configuration 100 of FIG. 1, a particular zone can contain one or more zone players. For example, the family room of FIG. 1 contains two zone players 106 and 108, while the kitchen is shown with one zone player 102. Zones can be dynamically configured by positioning a zone player in a room or space and assigning via the controller 130 the zone player to a new or existing zone. As such, zones can be created, combined with another zone, removed, and given a specific name (e.g., "Kitchen"), if so programmed. The zone players 102 to 124 are coupled directly or indirectly to a data network, such as the data network 128 shown in FIG. 1. The data network 128 is represented by an octagon in the figure to stand out from other components shown in the figure. While the data network 128 is shown in a single location, it is understood that such a network can be distributed in and around the system configuration 100.

Particularly, the data network 128 can be a wired network, a wireless network, or a combination of both. In some embodiments, one or more of the zone players 102-124 are wirelessly coupled to the data network 128 based on a proprietary mesh network. In some embodiments, one or more of the zone players 102-124 are wirelessly coupled to the data network 128 using a non-mesh topology. In some embodiments, one or more of the zone players 102-124 are coupled via a wire to the data network 128 using Ethernet or similar technology. In addition to the one or more zone players 102-124 connecting to the data network 128, the data network 128 can further allow access to a wide area network, such as the Internet.

In certain embodiments, the data network 128 can be created by connecting any of the zone players 102-124, or some other connecting device, to a broadband router. Other zone players 102-124 can then be added wired or wirelessly to the data network 128. For example, a zone player (e.g., any of zone players 102-124) can be added to the system configuration 100 by simply pressing a button on the zone player itself, which enables a connection to be made to the data network 128. The broadband router can be connected to an Internet Service Provider (ISP), for example. The broadband router can be used to form another data network within the system configuration 100, which can be used in other applications (e.g., web surfing). The data network 128 can also be used in other applications, if so programmed. Further, in certain embodiments, the data network 128 is the same network used for other applications in the household.

In certain embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for someone to pass through zones while seamlessly listening to the audio. Further, zones can be put into a "party mode" such that all associated zones will play audio in synchrony.

In certain embodiments, a zone contains two or more zone players. For example, the family room contains two zone players 106 and 108, and the home theater room contains at least zone players 116, 118, and 120. A zone can be configured to contain as many zone players as desired, and for example, the home theater room might contain additional zone players to play audio from a 5.1 channel or greater audio source (e.g., a movie encoded with 5.1 or greater audio channels). If a zone contains two or more zone players, such as the two zone players 106 and 108 in the family room, then the two zone players 106 and 108 can be configured to play the same audio source in synchrony, or the two zone players 106 and 108 can be paired to play two separate sounds in left and right channels, for example. In other words, the stereo effects of a sound can be reproduced or enhanced through the two zone players 106 and 108, one for the left sound and the other for the right sound. In certain embodiments, paired zone players can play audio in synchrony with other zone players.

In certain embodiments, three or more zone players can be configured to play various channels of audio that is encoded with three channels or more sound. For example, the home theater room shows zone players 116, 118, and 120. If the sound is encoded as 2.1 channel audio, then the zone player 116 can be configured to play left channel audio, the zone player 118 can be configured to play right channel audio, and the zone player 120 can be configured to play bass frequencies. Other configurations are possible and depend on the number of zone players and the type of audio. Further, a particular zone can be configured to play a 5.1 channel audio in one instance, such as when playing audio from a movie, and then dynamically switch to play stereo, such as when playing audio from a two channel source.

In certain embodiments, two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player will have additional speaker drivers from which sound can be passed. The consolidated zone player can further be paired with a single zone player or yet another consolidated zone player. Each playback device of a consolidated playback device is preferably set in a consolidated mode.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and reconnecting speaker wire, for example, to individual, discrete speakers to create different configurations. As such, certain embodiments described herein provide a more flexible and dynamic platform through which sound reproduction can be offered to the end-user.

Sources of audio content to be played by zone players 102-124 are numerous. Music from a personal library stored on a computer or networked-attached storage (NAS) can be accessed via the data network 128 and played. Internet radio stations, shows, and podcasts can be accessed via the data network 128. Music services that let a user stream and download music and audio content can be accessed via the data network 128. Further, music can be obtained from traditional sources, such as a turntable or CD player, via a line-in connection to a zone player, for example. Audio content can also be accessed through AirPlay™ wireless technology by Apple, Inc., for example. Audio content received from one or more sources can be shared amongst the zone players 102 to 124 via the data network 128 and/or the controller 130. The above-disclosed sources of audio content are referred to herein as network-based audio information sources. However, network-based audio information sources are not limited thereto.

The example home theater zone players 116, 118, 120 are coupled to an audio information source such as a television 132. In some examples, the television 132 is used as a source of audio for the home theater zone players 116, 118, 120, while in other examples audio information from the television 132 can be shared with any of the zone players 102-124 in the audio system 100.

III. Example Playback Device

Figure 4:
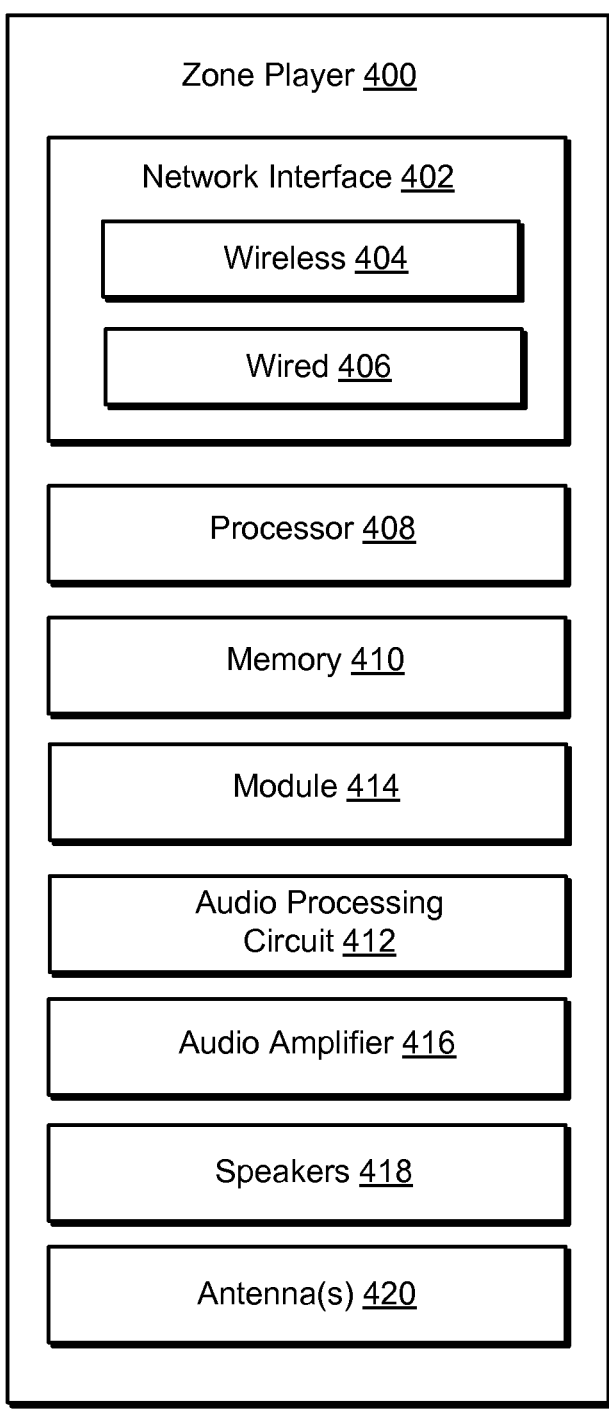
FIG. 4 shows an internal functional block diagram of an example zone player.

Referring now to FIG. 4, there is shown an example functional block diagram of a zone player 400 in accordance with an embodiment. The zone player 400 of FIG. 4 includes a network interface 402, a processor 408, a memory 410, an audio processing component 412, a module 414, an audio amplifier 416, and a speaker unit 418 coupled to the audio amplifier 416. FIG. 2A shows an example illustration of such a zone player. Other types of zone players can not include the speaker unit 418 (e.g., such as shown in FIG. 2B) or the audio amplifier 416 (e.g., such as shown in FIG. 2C). Further, it is contemplated that the zone player 400 can be integrated into another component. For example, the zone player 400 could be constructed as part of a lamp for indoor or outdoor use.

Referring back to FIG. 4, the network interface 402 facilitates a data flow between zone players and other devices on a data network (e.g., the data network 128 of FIG. 1) and the zone player 400. In some embodiments, the network interface 402 can manage the assembling of an audio source or file into smaller packets that are to be transmitted over the data network or reassembles received packets into the original source or file. In some embodiments, the network interface 402 can further handle the address part of each packet so that it gets to the right destination or intercepts packets destined for the zone player 400. Accordingly, in certain embodiments, each of the packets includes an Internet Protocol (IP)-based source address as well as an IP-based destination address.

In some embodiments, the network interface 402 can include one or both of a wireless interface 404 and a wired interface 406. The wireless interface 404, also referred to as an RF interface, provides network interface functions for the zone player 400 to wirelessly communicate with other devices (e.g., other zone player(s), speaker(s), receiver(s), component(s) associated with the data network 128, and so on) in accordance with a communication protocol (e.g., any of the wireless standards IEEE 802.11a, 802.11b, 802.11g, 802.11n, or 802.15). To receive wireless signals and to provide the wireless signals to the wireless interface 404 and to transmit wireless signals, the zone player 400 of FIG. 4 includes one or more antennas 420. The wired interface 406 provides network interface functions for the zone player 400 to communicate over a wire with other devices in accordance with a communication protocol (e.g., IEEE 802.3). In some embodiments, a zone player includes both of the interfaces 404 and 406. In some embodiments, a zone player 400 includes only the wireless interface 404 or the wired interface 406.

In some embodiments, the processor 408 is a clock-driven electronic device that is configured to process input data according to instructions stored in memory 410. The memory 410 is data storage that can be loaded with one or more software modules 414, which can be executed by the processor 408 to achieve certain tasks. In the illustrated embodiment, the memory 410 is a tangible machine readable medium storing instructions that can be executed by the processor 408. In some embodiments, a task might be for the zone player 400 to retrieve audio data from another zone player or a device on a network. In some embodiments, a task might be for the zone player 400 to send audio data to another zone player or device on a network. In some embodiments, a task might be for the zone player 400 to synchronize playback of audio with one or more additional zone players. In some embodiments, a task might be to pair the zone player 400 with one or more zone players to create a multi-channel audio environment. Additional or alternative tasks can be achieved via the one or more software modules 414 and the processor 408.

The audio processing component 412 can include one or more digital-to-analog converters (DAC), an audio preprocessing component, an audio enhancement component or a digital signal processor, and so on. In certain embodiments, the audio that is retrieved via the network interface 402 is processed and/or intentionally altered by the audio processing component 412. Further, the audio processing component 412 can produce analog audio signals. The processed analog audio signals are then provided to the audio amplifier 416 for play back through speakers 418. In addition, the audio processing component 412 can include necessary circuitry to process analog or digital signals as inputs to play from zone player 400, send to another zone player on a network, or both play and send to another zone player on the network. An example input includes a line-in connection (e.g., an auto-detecting 3.5 mm audio line-in connection).

The audio amplifier 416 is a device that amplifies audio signals to a level for driving one or more speakers 418. The one or more speakers 418 can include an individual transducer (e.g., a "driver") or a complete speaker system that includes an enclosure including one or more drivers. A particular driver can be a subwoofer (for low frequencies), a mid-range driver (middle frequencies), and a tweeter (high frequencies), for example. An enclosure can be sealed or ported, for example.

A zone player 400 can also be referred to herein as a playback device. An example playback device includes a Sonos® Play:5, which is manufactured by Sonos, Inc. of Santa Barbara, Calif. The Play:5 is an example zone player with a built-in amplifier and speakers. In particular, the Play:5 is a five-driver speaker system that includes two tweeters, two mid-range drivers, and one subwoofer. When playing audio content via the Play:5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies, just from different channels of audio. Audio from Internet radio stations, online music and video services, downloaded music, analog audio inputs, television, DVD, and so on, can be played from a Sonos® Play:5. While the Play:5 is an example of a zone player with speakers, it is understood that a zone player with speakers is not limited to one with a certain number of speakers (e.g., five speakers as in the Play:5), but rather can contain one or more speakers. Further, a zone player can be part of another device, which might even serve a purpose different than audio (e.g., a lamp).

IV. Example Controller

Figure 5:
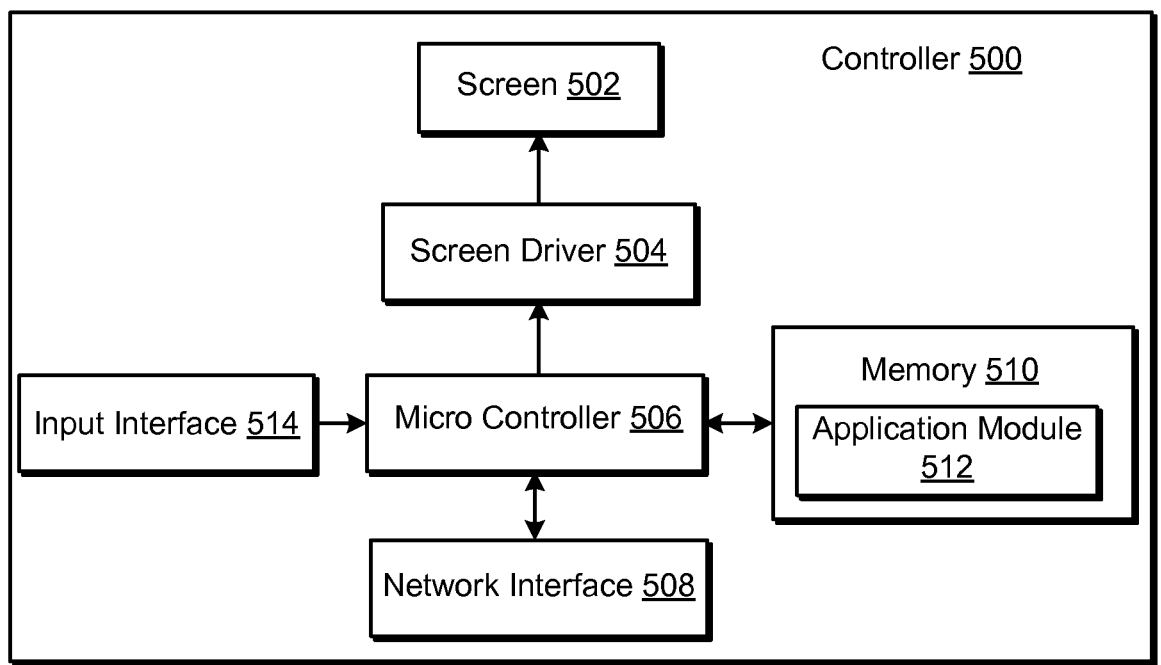
FIG. 5 shows an internal functional block diagram of an example controller.

Referring now to FIG. 5, there is shown an example controller 500, which can correspond to the controlling device 130 in FIG. 1. The controller 500 can be used to facilitate the control of multi-media applications, automation and others in a system. In particular, the controller 500 is configured to facilitate a selection of a plurality of audio sources available on the network and enable control of one or more zone players (e.g., the zone players 102-124 in FIG. 1) through a wireless network interface 508. According to one embodiment, the wireless communications is based on an industry standard (e.g., infrared, radio, wireless standards IEEE 802.11a, 802.11b 802.11g, 802.11n, or 802.15). Further, when a particular audio is being accessed via the controller 500 or being played via a zone player, a picture (e.g., album art) or any other data, associated with the audio source can be transmitted from a zone player or other electronic device to the controller 500 for display.

The controller 500 is provided with a screen 502 and an input interface 514 that allows a user to interact with the controller 500, for example, to navigate a playlist of many multimedia items and to control operations of one or more zone players. The screen 502 on the controller 500 can be an LCD screen, for example. The screen 500 communicates with and is commanded by a screen driver 504 that is controlled by a microcontroller (e.g., a processor) 506. The memory 510 can be loaded with one or more application modules 512 that can be executed by the microcontroller 506 with or without a user input via the user interface 514 to achieve certain tasks. In some embodiments, an application module 512 is configured to facilitate grouping a number of selected zone players into a zone group and synchronizing the zone players for audio play back. In some embodiments, an application module 512 is configured to control the audio sounds (e.g., volume) of the zone players in a zone group. In operation, when the microcontroller 506 executes one or more of the application modules 512, the screen driver 504 generates control signals to drive the screen 502 to display an application specific user interface accordingly.

The controller 500 includes a network interface 508 that facilitates wireless communication with a zone player. In some embodiments, the commands such as volume control and audio playback synchronization are sent via the network interface 508. In some embodiments, a saved zone group configuration is transmitted between a zone player and a controller via the network interface 508. The controller 500 can control one or more zone players, such as 102-124 of FIG. 1. There can be more than one controller for a particular system. Further, a controller can be integrated into a zone player.

It should be noted that other network-enabled devices such as an iPhone®, iPad® or any other smart phone or network-enabled device (e.g., a networked computer such as a PC or Mac®) can also be used as a controller to interact or control zone players in a particular environment. In some embodiments, a software application or upgrade can be downloaded onto a network enabled device to perform the functions described herein.

In certain embodiments, a user can create a zone group including at least two zone players from the controller 500. The zone players in the zone group can play audio in a synchronized fashion, such that all of the zone players in the zone group play back an identical audio source or a list of identical audio sources in a synchronized manner such that no (or substantially no) audible delays or hiccups could be heard. Similarly, in some embodiments, when a user increases the audio volume of the group from the controller 500, the signals or data of increasing the audio volume for the group are sent to one of the zone players and causes other zone players in the group to be increased together in volume.

A user via the controller 500 can group zone players into a zone group by activating a "Link Zones" or "Add Zone" soft button, or de-grouping a zone group by activating an "Unlink Zones" or "Drop Zone" button. For example, one mechanism for 'joining' zone players together for audio play back is to link a number of zone players together to form a group. To link a number of zone players together, a user can manually link each zone player or room one after the other.

For example, assume that there is a multi-zone system that includes the following zones: Bathroom, Bedroom, Den, Dining Room, Family Room, and Foyer.

In certain embodiments, a user can link any number of the six zone players, for example, by starting with a single zone and then manually linking each zone to that zone.

In certain embodiments, a set of zones can be dynamically linked together using a command to create a zone scene or theme (subsequent to first creating the zone scene). For instance, a "Morning" zone scene command can link the Bedroom, Office, and Kitchen zones together in one action. Without this single command, the user would need to manually and individually link each zone. The single command might include a mouse click, a double mouse click, a button press, a gesture, or some other programmed action. Other kinds of zone scenes can be programmed.

In certain embodiments, a zone scene can be triggered based on time (e.g., an alarm clock function). For instance, a zone scene can be set to apply at 8:00 am. The system can link appropriate zones automatically, set specific music to play, and then stop the music after a defined duration. Although any particular zone can be triggered to an "On" or "Off" state based on time, for example, a zone scene enables any zone(s) linked to the scene to play a predefined audio (e.g., a favorable song, a predefined playlist) at a specific time and/or for a specific duration. If, for any reason, the scheduled music failed to be played (e.g., an empty playlist, no connection to a share, failed Universal Plug and Play (UPnP), no Internet connection for an Internet Radio station, and so on), a backup buzzer can be programmed to sound. The buzzer can include a sound file that is stored in a zone player, for example.

V. Controlling an Audio Playback Device

Figure 6:
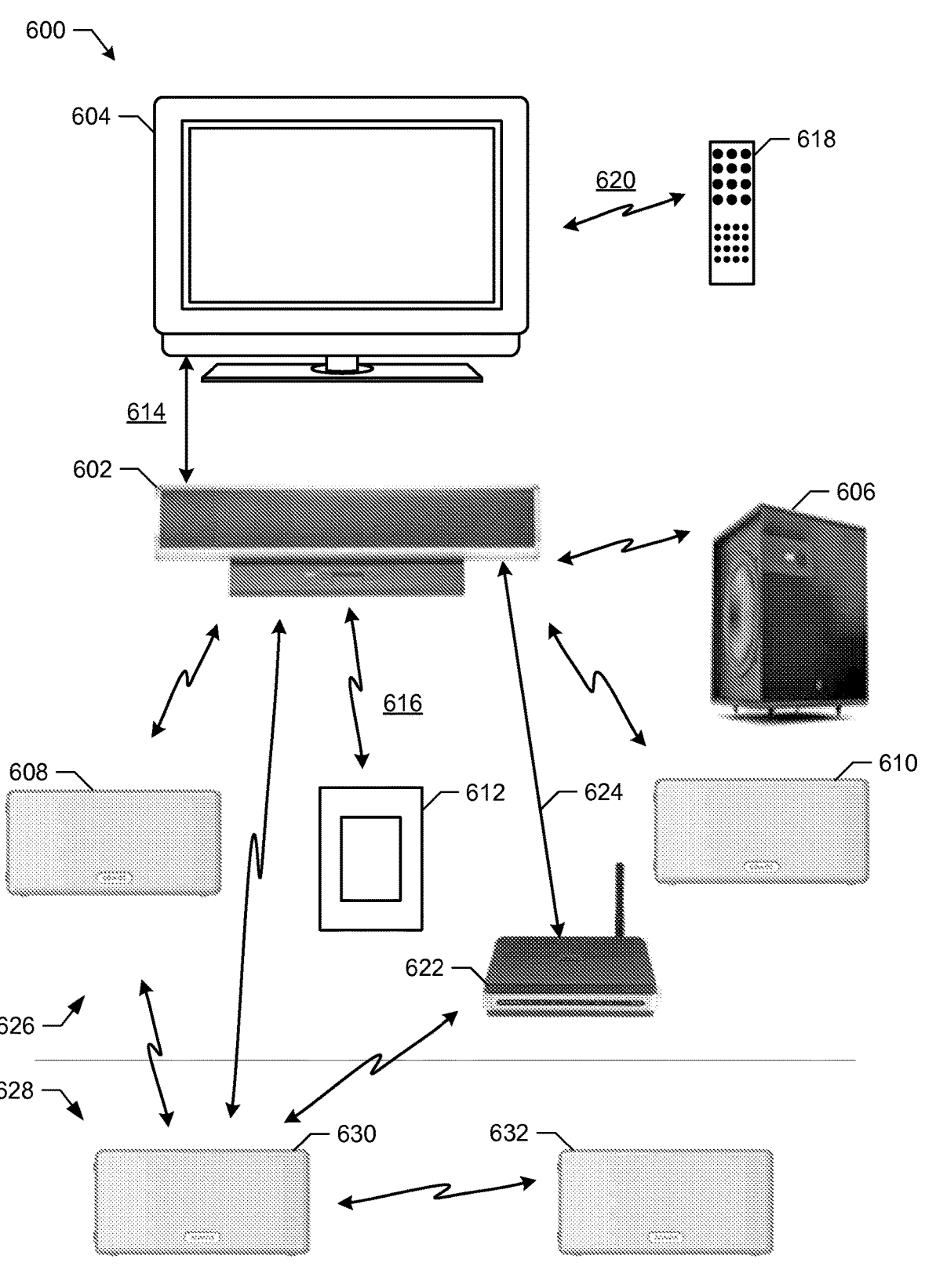
FIG. 6 shows an example system including an audio playback device and an audio information source.

FIG. 6 shows an example system 600 including an audio playback device 602 and an audio information source 604. The example audio playback device 602 of FIG. 6 is a zone player such as the zone player 400 described above with reference to FIG. 4, a sound bar, a center channel speaker, and/or a combination of a center channel speaker and left and right channel speakers. The example audio playback device 602 is located within a zone that also includes additional zone players such as a subwoofer 606 and rear surround devices 608, 610. The illustrated example of FIG. 6 can be used as a home theater system in combination with a television (e.g., the audio information source 604). A controller 612 is in communication with the audio playback device 602 to control, for example, selection of a signal source to be played by the audio playback device 602, the subwoofer 606, and/or the rear surround devices 608, 610.

In the illustrated example of FIG. 6, the audio playback device 602 is coupled to the example audio information source 604 via a wired connection 614. In some other examples, the wired connection 614 may be replaced and/or augmented using a wireless connection. The wired connection 614 transmits audio information, control messages, audio and/or video metadata, and/or other information between the audio playback device 602 and the audio information source 604. An example wired connection that may be used to implement the wired connection 614 is Ethernet. In some examples, the audio information source 604 adjusts a volume of the transmitted audio information to a volume scale defined by the audio playback device 602. While some audio information sources, such as televisions, are provided with audio output mechanisms (e.g., speakers), in the example system 600 the audio playback device 602 outputs the audio instead of any audio output mechanisms on the audio information source 604.

The example audio playback device 602 can select between multiple different sources of audio information, of which one is the audio information source 604. In some examples, the audio information source 604 represents multiple potential sources of audio information when the audio information source 604 functions as a switch or hub for additional devices. In some embodiments, the audio information source 604 is a television that can switch between different input devices such as video game consoles, cable, satellite, and/or broadcast television programs, DVD players, Blu-ray players, video cassette players, digital video players, and/or any other input device.

In the example of FIG. 6, the audio playback device 602 and the audio information source 604 each have a dedicated user input device. The example audio playback device 602 communicates with the controller 612 via a wireless connection 616. The controller 612 can be implemented using, for example, the controller 500 of FIG. 5. Using the controller 612, a user of the system 600 can control the example audio playback device 602 to, for example, change an audio output volume of the audio playback device 602 (e.g., increase volume, decrease volume, mute, and so on), change a signal source from which the audio playback device 602 is to obtain audio information to be played, configure which zones are to play audio from particular audio information sources, and/or perform any other settings and/or configuration adjustment to the audio playback device 602.

The example audio information source 604 communicates with a separate user input device 618 via a wireless connection 620. The user input device 618 can include one or more of a remote control (e.g., a remote control corresponding to the television, a universal remote control, etc.) containing one or more command buttons, a set of buttons on a physical housing or bezel of the audio information source, and/or a software device communicatively coupled to the audio information source 604. The wireless connection 620 can be an infrared connection, a Bluetooth connection, and/or any other past, present, and/or future wireless connection. Using the user input device 618, a user of the system 600 can control the example audio information source 604 to, for example, communicate a volume command to the audio information source 604, change an input to the audio information source 604, power the audio information source 604 on and/or off, and/or otherwise perform any other settings and/or configuration adjustment to the audio information source 604.

In some examples, the user input devices 612, 618 may be combined into a combination (e.g., universal) remote control that can selectively and/or simultaneously interact with the audio playback device 602 and the audio information source 604. In some such examples, the audio playback device 602 and the audio information source 604 transmit messages and receive commands depending on which of the audio playback device 602 and the audio information source 604 the combination remote control is configured to interact with for a given command.

In addition to the example audio information source 604, the audio playback device 602 can select audio information sources, such as network-based audio information sources, via a router 622. The example audio playback device 602 is coupled to the example router 622 via a wired or wireless connection 624, which enables access to network-based audio information sources (e.g., via the Internet and/or a local area network).

The example messages transmitted and received by the example audio playback device 602 and the example audio information source 604 of FIG. 6 are packet-based messages, such as Ethernet packets. The type of the message (e.g., volume message, source message, and so on) and/or any additional information (e.g., volume up, volume down, mute, unmute, specified audio information source, and so on) can be carried, for example, in the payload of the packet-based message. Packet-based messages can also be used to transmit the audio information from the audio information source 604 to the audio playback device 602.

The example system 600 of FIG. 6 is divided into multiple groups 626, 628. Each of the groups 626, 628 may be located, for example, in a different room of a larger location (e.g., a house). The example group 626 includes audio playback device 602, the audio information source 604, the subwoofer 606, the rear surround devices 608, 610, the user input device 618, and the router 622. The example group 628 includes two audio playback devices 630, 632 (e.g., zone players). The example user input device 612 is mobile and may be in the same physical location as either of the example groups 626, 628, or neither of them, at any given time.

The example audio playback devices 630, 632 in the group 628 are grouped in a master-slave arrangement, where one of the audio playback devices 630, 632 communicates with the group 626 and/or the router 622 to receive and/or provide audio information, synchronizing signals, and/or commands. The audio playback devices 630, 632 then communicate with each other to receive and/or provide audio information, synchronizing signals, and/or commands.

While the example groups 626, 628 of FIG. 6 are positioned in different locations, the groups 626, 628 may be combined at a user's direction (e.g., via the user input device 612) such that the devices 602, 606, 608, 610, 630, 632 play the same audio in synchrony. The user may additionally or alternatively direct one of the groups 626, 628 to play audio originating from the audio information source 604 while the other of the groups 626, 628 plays other audio originating from another source of audio information (e.g., via the router 622).

Figure 15:
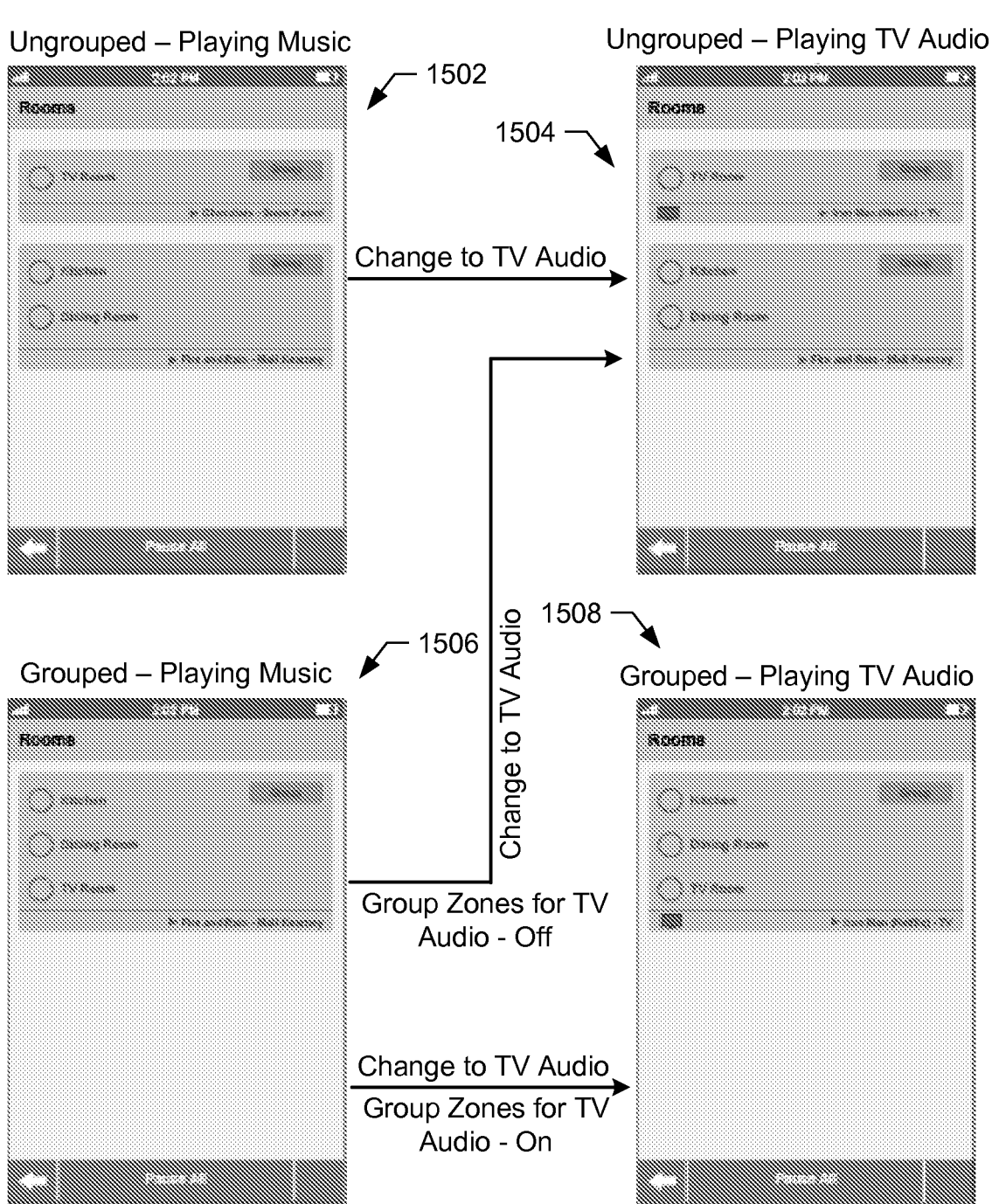
FIG. 15 illustrates example interface screens for an example user input device in different states of the example system of FIG. 6.

FIG. 15 illustrates example interface screens 1502, 1504, 1506, 1508 for the example user input device 612 in different states of the example system 600 of FIG. 6. A first example interface screen 1502 of FIG. 15 illustrates a display on the user input device 612 when the groups 626, 628 are ungrouped and the group 626 (e.g., TV Room group) is playing audio from a different source than the group 628 (e.g., Kitchen group) and another example group (e.g., Dining Room group). When the example audio playback device 602 changes a signal source to the audio information source 604, the example user input device 612 updates the interface screen to a second interface screen 1504 to inform the user that the group 626 is playing audio from the audio information source 604 while the other groups continue to play audio from the same source.

A third example interface screen 1506 informs the user that all of the groups are playing the same audio. When the example audio playback device 602 changes a signal source to the audio information source 604, the grouping may persist or change. If the example grouping illustrated in the interface screen 1506 persists, the example groups change a signal source to the audio information source 604 and the user input device 612 updates to display a fourth example interface screen 1508 to inform the user of the change. In contrast, if the example grouping changes (e.g., due to a desired configuration of the user), the group 626 splits from the other groups and begins playing audio from the audio information source 604 while the other groups continue playing audio from the same source as before the grouping change. In such an example, the user input device 612 updates to display the example display screen 1504 (or another display screen corresponding to the changed groupings) to inform the user of the change in the groupings.

In some examples, when the audio playback device 602 changes from one audio information source (e.g., an Internet music source) to the audio information source 604, the example audio playback device 602 determines whether a scene is triggered by the change of the signal source to the audio information source 604 (e.g., from a different audio information source). As used herein, a scene is a grouping of zone players that are configured (e.g., by a user) to perform one or more actions (e.g., play audio from a particular audio information source) at the performance of an event (e.g., a time of day, a change in an audio information source, etc.). For example, a user may have programmed a scene (e.g., "TV Scene") in which changing a signal source of the audio playback device 602 triggers a zone grouping in which the audio playback device 602, the subwoofer 606, and the rear surround speakers 608, 610 of FIG. 6 automatically configure themselves into a zone for the playback of audio from the audio information source 604. In some such examples, the scene further includes the audio playback devices 630, 632 performing the same actions as the devices 602, 606-610 and/or different actions (e.g., mute, power down, change to a different audio information source). In some examples, the user may configure a scene that includes playing audio from the audio information source 604 via a zone grouping including one or more of the devices 606-610, 630, 632, but not including the audio playback device 602. Scenes may specify audio to be played via multiple devices 602, 606-610, 630, 632 and/or groups 630, 632 in isolation and/or in synchronicity.

When the example TV Scene is triggered, the example audio playback device 602 of FIG. 6 configures the appropriate zone group(s) according to the scene settings. To change scenes, the audio playback device 602 signals one or more other speakers (e.g., the subwoofer 606, the rear surround devices 608, 610) and/or one or more other group(s) 630 to change to the audio information source 604. Additionally or alternatively, when the audio playback device 602 changes from the audio information source 604 to another audio information source, the audio playback device 602 may signal one or more other speaker(s) and/or group(s) to change to the audio information source. Using the user input device 612, the user may control which of the speakers and/or groups are configured to change to the audio information source 604. In response to the change in groupings resulting from the scene, the example user input device 612 changes display screens (e.g., changing from the display screen 1506 showing grouped zones to the display screen 1504 or the display screen 1508 based on the scene configuration). In some examples, the audio information source 602 signals to the other speaker(s) and/or group(s) to change a playback volume when the audio playback device 602 receives a corresponding volume command from the user interface device 612 and/or a volume message from the audio playback device 604.

In some examples, the audio playback device 602 and the audio information source 604 may be used to configure the groups 628, 630, scenes, and/or other user-configurable settings for the audio playback devices 602, 630, 632, the subwoofer 606, and/or the rear surround speakers 608, 610.

For example, the user interface device 612 may control the audio playback device 602, which displays the zone configuration(s) and/or potential configuration(s) to the user via the audio information source 604 (e.g., a television monitor), to configure the zones. The audio playback device 602 communicates display information to the audio information source 604 for display to the user, who may prefer to view the configuration of the groups 628, 630 on the larger display area of the audio information source 604 instead of a smaller display area of the user interface device 612.

Figure 7:
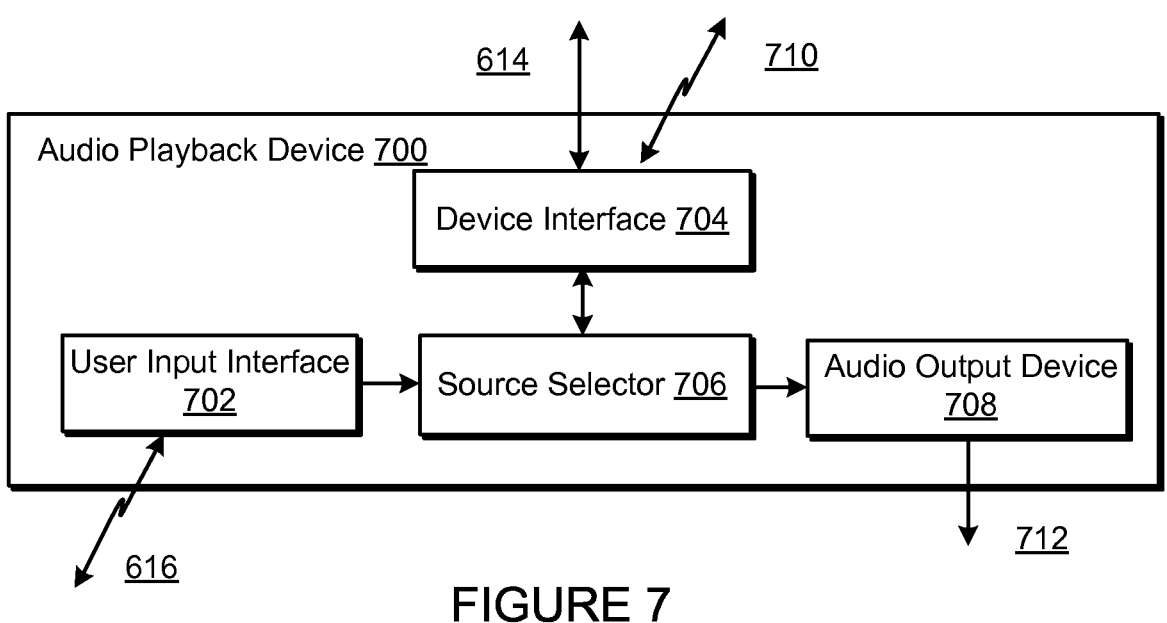
FIG. 7 shows an internal functional block diagram of an example audio playback device.

FIG. 7 shows an internal functional block diagram of an example audio playback device 700. The example audio playback device 700 of FIG. 7 can be used to implement any of the zone players 200, 202, 204 of FIGS. 2A-2C, the zone player 400 of FIG. 4, and/or the audio playback device 602 of FIG. 6 to output audio based on an audio information source. The example audio playback device 700 of FIG. 7 includes a user input interface 702, a device interface 704, a source selector 706, and an audio output device 708.

The example user input interface 702 communicates with user input devices, such as the controller 500 of FIG. 5 and/or the user input device 612 of FIG. 6. In some examples, the user input devices 500, 612 are configured to control zone players. As illustrated in FIG. 7, the user input interface 702 communicates with the user input device 612 via the wireless connection 616. The user input interface 702 receives commands from user input device 612, which can include a selection by a user of the user input device 612 of a different audio information source than an audio information source currently being used. Additionally, the user input interface 702 can receive volume commands to increase, decrease, and/or mute the volume being output from the audio playback device 700, and/or to change the playing of audio by, for example, pausing, unpausing, skipping audio tracks, fast-forwarding the audio being played, rewinding the audio being played, and/or stopping playback of the audio.

In some embodiments, the user input interface 702 is implemented using the wireless interface 404, the wired interface 406 and/or, more generally, the network interface 402 of FIG. 4. Other implementations can additionally or alternatively be used to provide the user input interface 702.

The example device interface 704 interfaces with, among other things, the audio information source 604, via wired and/or wireless connections 614, 710. The device interface 704 receives messages, audio information, metadata, and/or other information from the audio information source 604 via the example wired connection 614. The example device interface 704 also receives messages from the audio information source 604 via the wired connection 614. In some embodiments, the example playback device 700 communicates with other playback devices such as zone players.

In some embodiments, the device interface 704 is implemented using the wireless interface 404, the wired interface 406 and/or, more generally, the network interface 402 of FIG. 4. Other implementations can additionally or alternatively be used to provide the device interface 704.

In some embodiments, the device interface 704 receives audio information to be played via the audio playback device 700 from the audio information source 604 at a first time. At some later time, the user decides to listen to audio from a different source while keeping the audio information source 604 in a powered-on state (e.g., listen to music while continuing to watch a program on television, listen to a radio broadcast of a sporting event while watching the video broadcast on television, and so on). The example device interface 704 transmits a message to the example audio information source 604 to cause the audio information source to change its volume to a mute setting.

The example source selector 706 of FIG. 7 selects a signal source to be used to play back audio based on the user input interface 702 and/or the device interface 704. The source selector 706 provides audio information associated with the selected signal source to the audio output device 708 to be transformed into audio output signals (e.g., acoustic signals, stereo analog output signals to an external speaker, and so on). For example, the source selector 706 can select a particular audio information source specified by a user via a user input device, which transmits command(s) that are received via the user input interface 702. In other examples, the source selector 706 selects the audio information source 604 in response to a message received at the device interface 704 (e.g., a source message, a volume message from the audio information source 604). In some embodiments, if the source selector 706 has selected an audio information source different than the audio information source 604 and the audio information source 604 then sends a source message to the audio playback device 700 (e.g., to the device interface 704), the source selector 706 changes the selected source to the audio information source 604.

In some embodiments, the example source selector 706 also manages a system volume of audio to be played back. The example source selector 706 can change the system volume based on a command received via the user input interface 702 and/or based on a message received via the device interface 704. For example, the device interface 704 can receive a volume message (e.g., a message instructing the audio playback device 700 to increase, decrease, or mute the volume of playback) from the audio information source 604 when a user of the system uses a user input device configured to control the audio information source (e.g., a television remote control for a television audio information source).

In some embodiments, the source selector 706 is implemented using the example processor 408 and the example memory 410 of FIG. 4. Other implementations can additionally or alternatively be used to provide the source selector 706.

The example audio output device 708 outputs audio signals 712 based on input audio information from a selected audio information source and based on a volume setting. The example source selector 706 selects the audio information source, provides received audio information from the selected audio information source to the audio output device 708, and provides a volume setting at which the audio output device 708 is to output the audio signals 712. Example audio signals 712 can include acoustic signals output from one or more speaker(s) and/or analog and/or digital electrical signals output to an acoustic output device external to the audio playback device 700.

In some embodiments, the audio output device 708 is implemented using the example audio processing circuit 412, the example audio amplifier 416, and/or the example speaker(s) 418 of FIG. 4. Other implementations can additionally or alternatively be used to provide the audio output device 708.

Figure 8:
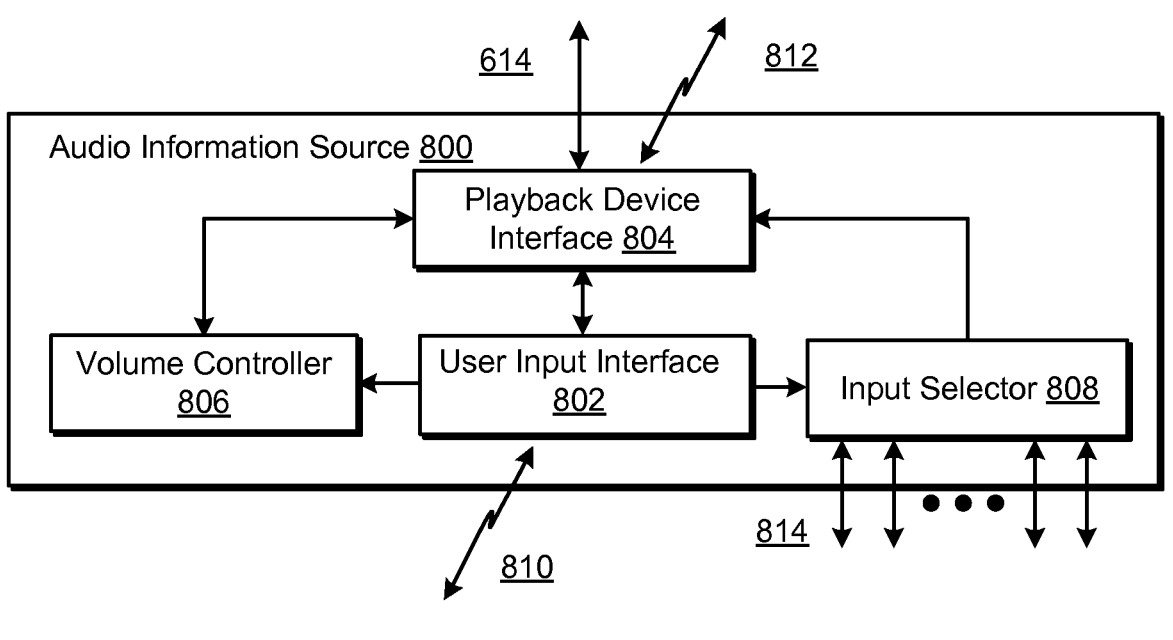
FIG. 8 shows an internal functional block diagram of an example audio information source.

FIG. 8 shows an internal functional block diagram of an example audio information source 800. The example audio information source 800 of FIG. 8 can be used to implement the audio information source 604 of FIG. 6 to selectively provide audio information to the audio playback device 602. The example audio information source 800 of FIG. 8 includes a user input interface 802, a playback device interface 804, a volume controller 806, and an input selector 808.

The example user input interface 802 of FIG. 8 receives commands from a user input device (e.g., a remote control) via a wireless connection 810. Example commands include volume commands (e.g., volume up, volume down, mute, unmute) and/or input selection commands (e.g., which of a set of input devices are to be a source of audio and/or video information).

The example playback device interface 804 of FIG. 8 sends messages, metadata, and/or audio information to an audio playback device (e.g., the audio playback devices 602, 700 of FIGS. 6 and 7) via a wired connection (e.g., the wired connection 614) and/or a wireless connection 812. The playback device interface 804 also receives messages from the audio playback device 602 via the wired connection 614 and/or the wireless connection 812.

The example volume controller 806 of FIG. 8 controls a volume setting of the example audio information source 800. The volume setting can be used by the audio information device 800 to modify output audio information to be louder or quieter when received by an audio playback device. When the example volume controller 806 is connected to an audio playback device such as the audio playback device 700 of FIG. 7, the example volume controller 806 causes the playback device interface 804 to transmit a volume message (via the wired connection 614 and/or the wireless connection 812) in response to the user input interface 802 receiving a corresponding volume command. For example, the playback device interface 804 transmits a volume down message when the user input interface 802 receives a volume down command from a user input device, transmits a volume up message when the user input interface 802 receives a volume up command from the user input device, and/or transmits a mute message when the user input interface 802 receives a mute command from the user input device.

In some embodiments, the volume controller 806 also controls the volume setting of the audio information source 800 in response to the playback device interface 804 receiving volume messages via the wired connection 614 and/or the wireless connection 812. For example, the playback device interface 804 can receive a mute message when the audio playback device 602 selects an audio information source different than the audio information source 800. In response, the volume controller 806 changes the volume setting of the audio information source 800 to a mute setting. At a later time, when the user input interface 802 receives a volume command, the volume controller 806 causes the playback device interface 804 to send a volume message to the audio playback device 602.

The example input selector 808 of FIG. 8 selects from one or more input devices via corresponding input connections 814. The input selector 808 provides audio information from a selected one of the input connections 814 to the example playback device interface 804. The playback device interface 804 provides the audio information to the audio playback device 602 via the wired connection 614 and/or the wireless connection 812.

In some embodiments, the audio information device 800 of FIG. 8 is an Internet-enabled television. In some such embodiments, the television is capable of downloading applications, or apps, which can be specialized software capable of performing specific functions. In other such embodiments, the television is provided with firmware stored on a memory and to be executed by a processor, the firmware to implement one or more of the user input interface 802, the playback device interface 804, the volume controller 806, and/or the input selector 808.

While the example audio playback device 602 and audio information source 604 have been illustrated in FIGS. 7 and 8, one or more of the interfaces, data structures, elements, processes and/or devices illustrated in FIGS. 7 and 8 can be combined, divided, re-arranged, omitted, eliminated and/or implemented in any way. Further, the example user input interface 702, the example device interface 704, the example source selector 706, the example audio output device 708, the example user input interface 802, the example playback device interface 804, the example volume controller 806, the example input selector 808, and/or more generally, the example audio playback device 602 and/or the example audio information source 604 can be implemented by hardware, software, firmware and/or any combination of hardware, software and/or firmware. Thus, for example, any of the example user input interface 702, the example device interface 704, the example source selector 706, the example audio output device 708, the example user input interface 802, the example playback device interface 804, the example volume controller 806, the example input selector 808, and/or more generally, the example audio playback device 602 and/or the example audio information source 604 could be implemented by one or more circuit(s), programmable processor(s), application specific integrated circuit(s) (ASIC(s)), programmable logic device(s) (PLD(s)) and/or field programmable logic device(s) (FPLD(s)), and so on.

When any apparatus claim of this patent is read to cover a purely software and/or firmware implementation, at least one of the example user input interface 702, the example device interface 704, the example source selector 706, the example audio output device 708, the example user input interface 802, the example playback device interface 804, the example volume controller 806, and/or the example input selector 808 are hereby expressly defined to include a computer readable medium such as a memory, DVD, CD, and so on, storing the software and/or firmware. Further still, the example audio playback device 602 and/or the example audio information source 604 can include one or more elements, processes and/or devices in addition to, or instead of, those illustrated in FIGS. 7 and 8, and/or can include more than one of any or all of the illustrated elements, processes and devices.

Figure 9:
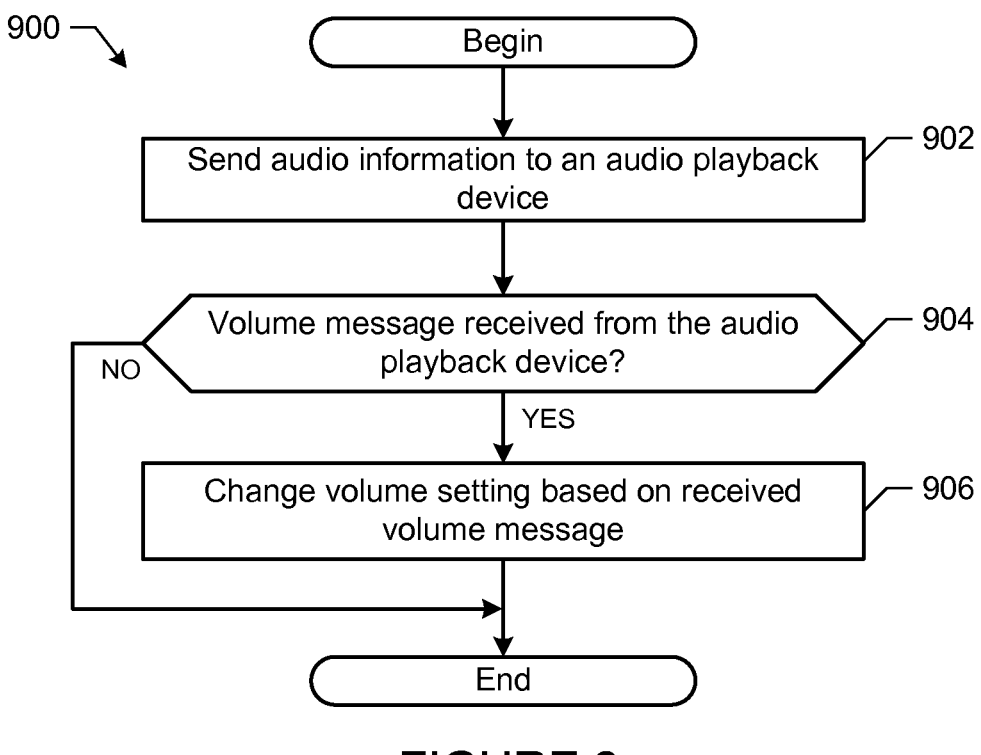
FIG. 9 shows a flowchart representative of an example method to control an audio information source.

FIG. 9 shows a flowchart representative of an example method 900 to control an audio information source such as a television. The example method 900 of FIG. 9 begins with the audio information source (e.g., the audio information source 604, 800 of FIGS. 6 and 8) sending audio information to an audio playback device (e.g., the audio playback device 602 of FIG. 6) (block 902). In some embodiments, the audio information source 604 sends the audio information over a packet-based connection. In some embodiments, the audio information source 604 includes a device interface (e.g., the device interface 804 of FIG. 8) to send the messages to the audio playback device 602 over a wired connection (e.g., the wired connection 614) and/or a wireless connection (e.g., the wireless connection 812).

The example method 900 then determines (e.g., via the playback device interface 804) whether a volume message is received from the playback device (block 904). If a volume message has been received (block 904), the example volume controller 806 changes a volume setting based on the received volume message 906. For example, if the received volume message is a mute message, the volume controller 806 changes the volume setting to a mute setting. Conversely, if the received volume message is an unmute message, the volume controller 806 changes the volume setting from a mute setting to a volume on (or unmute) setting.

The example method 900 can end and/or iterate after changing the volume setting (block 906) or if no volume message has been received from the audio playback device (block 904). In some embodiments, the example method 900 is performed repeatedly in a polling manner when the audio information source 604 is sending audio information to an audio playback device.

Figure 10:
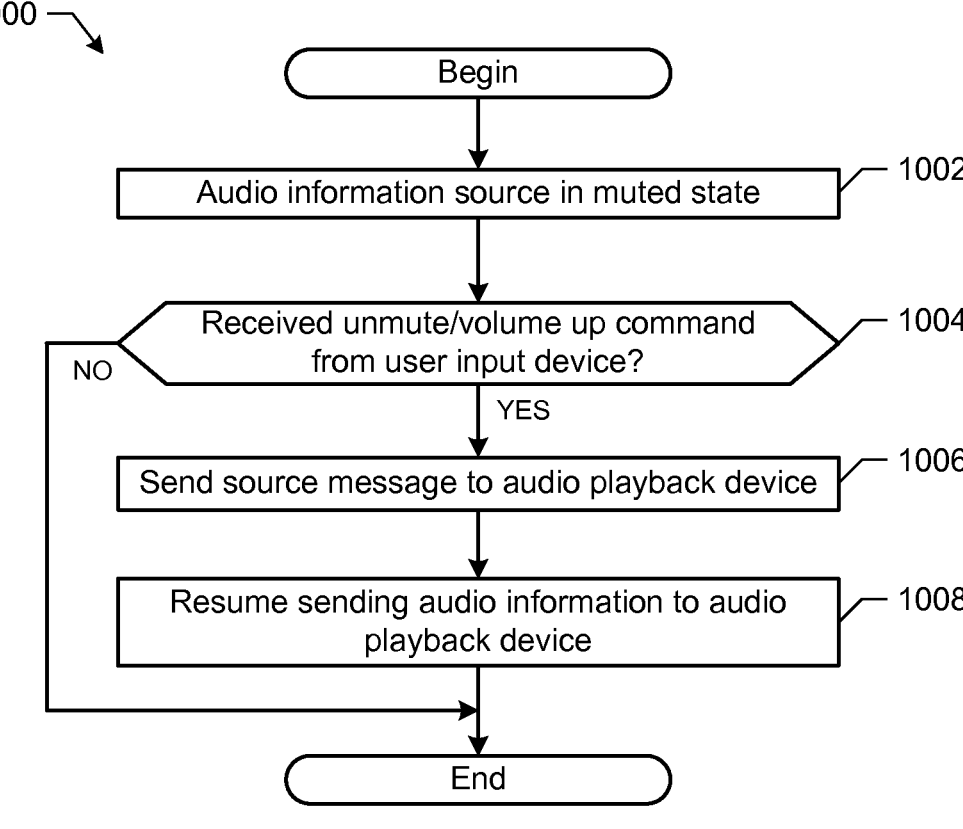
FIG. 10 shows a flowchart representative of an example method to control an audio information source of an audio playback device.

FIG. 10 shows a flowchart representative of an example method 1000 to control an audio information source (e.g., the audio information sources 604, 800 of FIGS. 6 and 8) for an audio playback device (e.g., the audio playback devices 602, 700 of FIGS. 6 and 7). The example method 1000 of FIG. 10 begins when the audio information source 604 is in a muted state (block 1002). For example, if the audio information source 604 is a television, the television is turned on and is displaying a video picture but is not outputting audio information.

In some examples, the television may display a nag screen to the user to provide information about the status of the television audio. For example, the television may display a nag screen with the word "mute" when the television is muted and/or when the television is outputting audio to the audio playback device 602 while speakers on the television are muted. In some other examples, the television does not display the nag screen even when the mute setting is activated. In some examples, the nag screen may display "Sound through External Speaker" when the television is outputting audio information to the audio playback device 602 (e.g., at the beginning of playback via the audio playback device 602 and/or when the user adjusts the volume via the user input device(s) 612, 618). Other nag screens may additionally or alternatively be used to display information to the user via the television.

The example audio information source 604 determines (e.g., via the user input interface 802 of FIG. 8) whether an unmute/volume up command has been received from a user input device (block 1004). If an unmute/volume up command has been received (block 1004), the example audio information source 604 (e.g., via the playback device interface 804) sends a source message to an audio playback device 602 (block 1006). In some embodiments, the source message causes the audio playback device 602 to select a signal source to be the audio information source 604 sending the source message. The example audio information source 604 resumes sending audio information to the audio playback device 602 (block 1008). For example, the input selector 808 receives input audio information, which the playback device interface 804 sends to the audio playback device 602 in packets or other transmission form.

The example method 1000 can end and/or iterate after resuming sending the audio information to the audio playback device 602 (block 1008) or if no unmute/volume up command has been received (block 1004). In some embodiments, the example method 1000 is performed repeatedly in a polling manner when the audio information source 604 is in a muted state.

FIG. 11 shows a flowchart representative of an example method 1100 to control a volume setting of an audio playback device (e.g., the audio playback devices 602, 700 of FIGS. 6 and 7). The example method 1100 is performed using the example audio information source 604 of FIG. 6, which is communicatively coupled to the example audio playback device 602 via a wired connection 614. The method 1100 of FIG. 11 begins when the audio information source 604 is sending (e.g., via the playback device interface 804 of FIG. 8) audio information to an audio playback device (e.g., the audio playback device 602) (block 1102). In some embodiments, the audio information source 604 sends the audio information to the audio playback device 602 using packet-based messages containing audio information.

The example audio information source 604 determines (e.g., via the user input interface 802 of FIG. 8) whether a volume up command has been received from a user input device (block 1104). If a volume up command has been received (block 1104), the audio information source 604 sends (e.g., via the playback device interface 804) a volume up message to the audio playback device 602 (block 1106).

The example audio information source 604 also determines whether a volume down command has been received from the user input device (block 1108). If a volume down command has been received (block 1108), the audio information source 604 sends a volume down message to the audio playback device (block 1110).

The example audio information source 604 further determines whether a mute command has been received from the user input device (block 1112). If a mute command has been received (block 1112), the example audio information source 604 sends a mute message to the audio playback device 602 (block 1114).

In some embodiments, if any of the blocks 1104, 1108, 1112 determine that a command has been received from a user input device, the other ones of the blocks 1104, 1108, 1112 are skipped and the method 1100 ends after the respective block 1106, 1110, 1114 is performed in response to determining that a command has been received at the block 1104, 1108, 1112. For example, if the audio information source 604 receives a volume up command from the user input device 618 (block 1104), the audio information source sends a volume up message to the audio playback device (block 1106) and then skips blocks 1108-1114.

In the example of FIG. 11, the method 1100 can end and/or iterate after sending a mute message to the audio playback device 602 (block 1114) or if no mute command has been received (block 1112). In some embodiments, the example method 1100 is performed repeatedly in a polling manner when the audio information source 604 is sending audio information to the audio playback device 602.

FIG. 12 shows a flowchart representative of an example method 1200 to control an audio playback device. The example method 1200 can be used to implement the example audio playback device 602, 700 of FIGS. 6 and 7 that is communicatively coupled to an audio information source 604 via a wired connection 614 and/or a wireless connection 710. The example method 1200 begins when the audio playback device 602 is receiving audio information from a network-based audio information source (block 1202). Example network-based audio information sources can include Internet subscription music services, Internet radio services, audio files located on a local area network and/or a wide area network, and so on.

The example audio playback device 602 generates audio signals based on audio information received from the net-work-based audio information source (block 1204). For example, the audio output device 708 can generate acoustic and/or electrical signals representative of the audio information received from the network-based audio information source. The example audio playback device 602 determines (e.g., via the device interface 704 of FIG. 7) whether a source message has been received from the audio information source 604 (block 1206). If a source message has been received (block 1206), the example audio playback device 602 changes (e.g., via the source selector 708) a signal source to the audio information source and begins receiving audio information from the audio information source (block 1208). As a result, the audio playback device 602 stops playing the audio from the network-based audio information source.

The example audio playback device 602 determines (e.g., via the device interface 704) whether a scene is triggered by the change of the signal source to the audio information source (block 1210). For example, a user may have pro-grammed a scene in which changing a signal source of the audio playback device 602 triggers a zone grouping in which the audio playback device 602, the subwoofer 608, and the rear surround speakers 610, 612 of FIG. 6 automatically configure themselves into a zone for the playback of audio from the audio information source 604. If a scene is trig-gered (block 1210), the example audio playback device 602 configures the appropriate zone group(s) according to the scene settings (block 1212).

After configuring the zone group(s) according to the scene settings (block 1212), or if a scene is not triggered by the change in signal source (block 1210), the audio playback device 602 generates audio signals (e.g., acoustic and/or electrical signals representative of the audio information) based on received audio information from the audio infor-mation source 604 (block 1214). To generate the audio signals, the example device interface 704 and/or the example source selector 706 can provide the audio information received from the audio information source 604 to the audio output device 708.

The example method 1200 can end and/or iterate after generating audio signals (block 1214) or if a source message has not been received (block 1206). In some embodiments, the example method 1200 is performed repeatedly in a polling manner when the audio playback device 602 is receiving audio information from a network-based audio information source.

Figure 13:
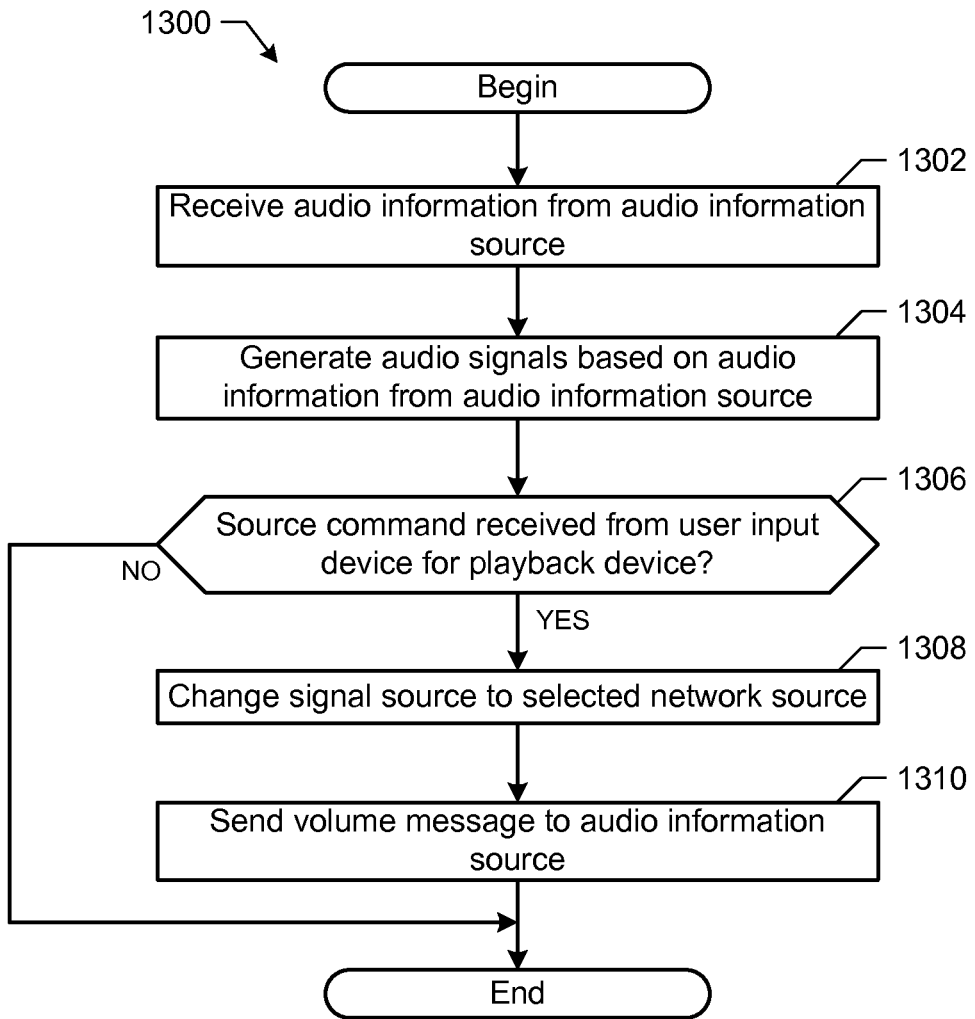
FIG. 13 shows a flowchart representative of another example method to control an audio playback device.

FIG. 13 shows a flowchart representative of another example method 1300 to control an audio playback device. The example method 1300 can be used to implement the example audio playback device 602, 700 of FIGS. 6 and 7 that is communicatively coupled to an audio information source 604 via a wired connection 614 and/or a wireless connection 710. The example method 1300 of FIG. 13 begins when the audio playback device 602 is receiving audio information from the audio information source 604 (block 1302).

The example audio playback device 602 generates audio signals (e.g., acoustic and/or electrical signals representative of the audio information) (block 1304). To generate the audio signals, the example device interface 704 and/or the example source selector 706 of FIG. 7 can provide the audio information received from the audio information source 604 to the audio output device 708. The audio playback device 602 determines whether a source command has been received (e.g., via the user input interface 702 of FIG. 7) from a user input device (e.g., the user input device 612 of FIG. 6) (block 1306). For example, a user of the system 600 of FIG. 6 can select a network-based audio information source using the user input device 612, which sends the source command to the audio playback device 602. If a source command has been received from the user input device 612, the audio playback device 602 changes a signal source to a network-based audio information source selected by the user (block 1308). The audio playback device 602 also sends (e.g., via the device interface 704) a volume message to the audio information source 704 (block 1310). In some embodiments, the volume message causes the audio information source 704 to change a volume setting to a mute state and/or to power down the audio information source 704.

The example method 1300 can end and/or iterate after sending the volume message (block 1310) or if a source command has not been received (block 1306). In some embodiments, the example method 1300 is performed repeatedly in a polling manner when the audio playback device 602 is receiving audio information from the audio information source 604.

Figure 14:
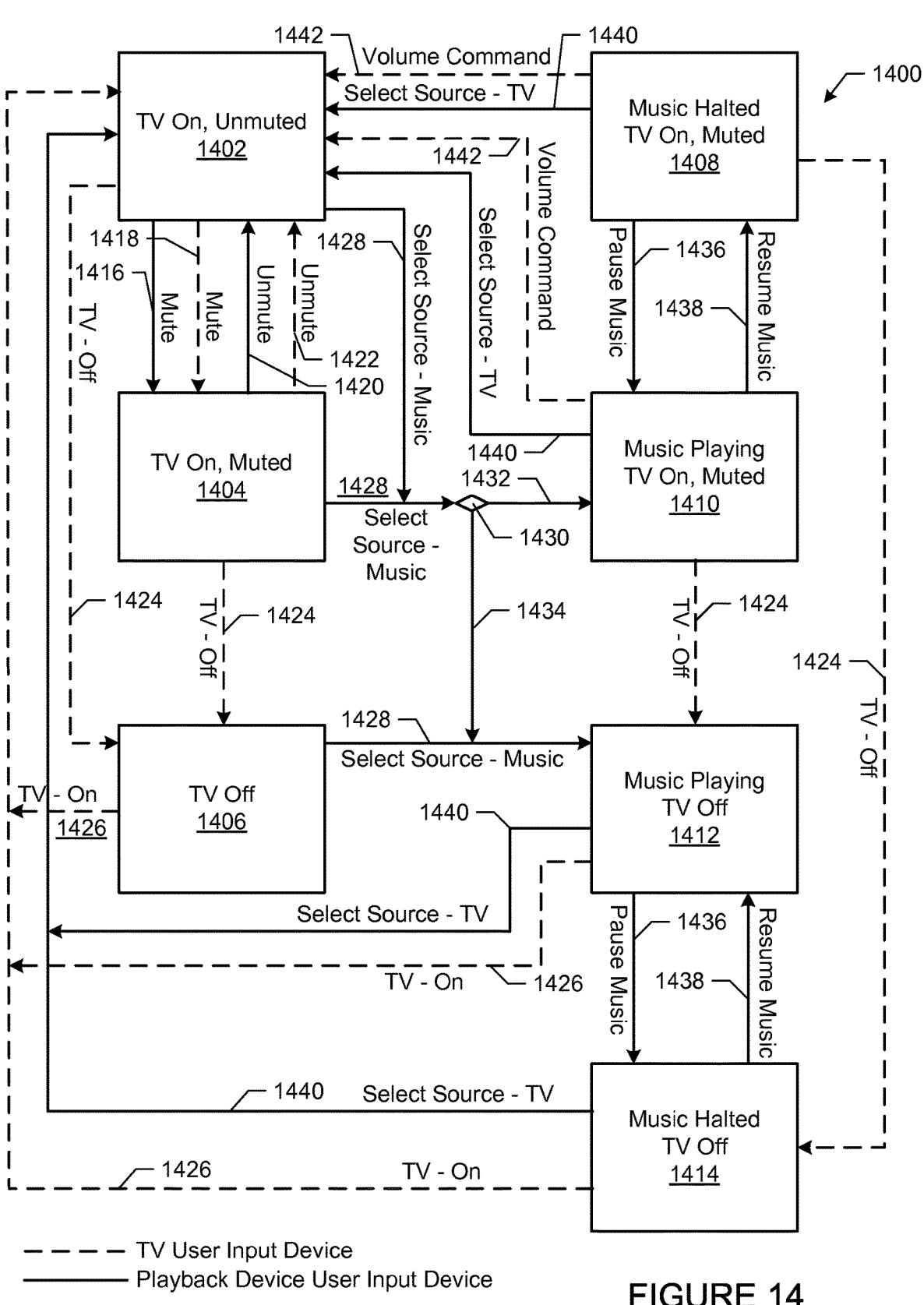
FIG. 14 shows a state diagram representative of instructions to control an example system to play back audio from an audio information source via a playback device.

FIG. 14 shows a state diagram 1400 representative of instructions to control an example system to play back audio from an audio information source via an audio playback device. The example state diagram 1400 shows multiple states 1402—and transitions of a system such as the system 600 of FIG. 6, which includes an audio information source 604 communicatively coupled to an audio playback device 602 via a wired connection 614. The example state diagram 1400 of FIG. 14 will be described herein with reference to an Internet-enabled television (the audio information source 604) connected to a zone player (the audio playback device 602). In the example, in addition to the television as an audio information source, the zone player also has access to a network-based source of music. However, the state diagram 1400 can be modified from the illustrated embodiment based on using different type(s) of audio playback devices 602 and/or audio information source 604.

The state diagram 1400 of FIG. 14 also shows different transitions 1416-1428, 1432-1442, which result from user interactions with the example audio playback device 602 and/or the example audio information source 604. For example, the transitions 1418, 1422, 1424, 1426, 1442 result from a user interacting with the audio information source 604 via the user input device 618, while the transitions 1416, 1420, 1428, 1432, 1434, 1436, 1438, 1440 result from a user interacting with the audio playback device 602 via the user input device 612.

At a first time, the example television is on and is in an unmuted state (state 1402). In the unmuted state, the example zone player is receiving audio information from the television and is outputting the audio information as acoustic signals. From the state 1402, the user can input a mute command using either the user input device 612 (transition 1416) or the user input device 618 (transition 1418). In the state 1404, the television is on and is in a muted state. From the state 1404, the user can input an unmute command (e.g., unmute, volume up, volume down, and so on) using either the user input device 612 (transition 1420) or the user input device 618 (transition 1422) to return to state 1402.

From either of the states 1402, 1404, the user can input a television power command (e.g., power off) (transition 1424) to cause the television to power down, moving into a television off state 1406. From the state 1406, the user can input a television power command (e.g., power-on) (transition 1426) to cause the television to power on, moving into the state 1402. During the states 1402, 1404, 1406, the zone player has the television selected as a signal source. In some embodiments, the zone player enters a power off state, a sleep state, or an inactive state when a selected signal source is in a power off state, a sleep state, and/or an inactive state.

From any of the states 1402, 1404, 1406, the user can input a source command (e.g., select source—music) via the user input device 612 (transition 1428). The example transition 1428 causes the zone player to send a volume message to the television and to select a different signal source such as a network-based music source. From the example states 1402, 1404 in which the television is on, the zone player can be provided with a setting 1430 that instructs the zone player what type of message to send to the television. In a first configuration (transition 1432), the zone player setting 1430 causes the zone player to issue a volume message (e.g., a mute message) to the television, causing the television to change to a muted volume setting at state 1410. In a second configuration (transition 1434), the zone player setting 1430 causes the zone player to issue a power off message to the television, causing the television to power off to a state 1412.

In the example state 1410, the zone player plays music from a network-based music source and the television is on and has a muted volume setting. From the state 1410, the user can input a pause command (transition 1436) to the zone player via the user input device 612 to change to the state 1408. In the example state 1408, the zone player has paused the music, although the zone player has not selected a different signal source, and the television is on and has a muted volume setting. The user can input an unpause command (transition 1438) to the zone player via the user input device 612 to change to the state 1410.

From either of the states 1408, 1410, the user can cause the zone player to select the television as the audio information source and change to the state 1402. In a first example method, the user can select the television as the audio information source for the zone player using the user input device 612 (transition 1440). In response, the example zone player selects the television as the audio information source and sends a volume message to the television to cause the television to unmute or increase volume. The television changes its volume setting based on the volume message so that the television is on and does not have a muted volume setting. The television begins and/or resumes transmitting audio information to the zone player, which plays back the audio. In a second example method, the user can send a volume command (e.g., unmute, volume up, volume down) to the television using the user input device 618 (transition 1442). The example television responds to the command by changing its volume setting and sending a source message to the zone player, which changes a signal source to the television and beings playing audio information received from the television.

From the states 1408, 1410, the user can use the user input device 618 to issue a TV off command to the television (transition 1424). From the state 1408, the transition 1424 results in a change to the state 1414, in which the television is powered off and the music playback by the zone player is stopped. From the state 1410, the transition 1424 results in a change to the state 1412, in which the zone player is playing back the music and the television is powered off From the example state 1412, the user can input a pause command (transition 1436) to the zone player via the user input device 612 to change to the state 1414. From the example state 1414, the user can input an unpause command (transition 1438) to the zone player via the user input device 612 to change to the state 1412.

From either of the states 1412, 1414, the user can change to the state 1402. The example state diagram 1400 assumes that when the user powers the television on from an off state, the user wishes to play back the audio information from the television via the zone player. However, this example assumption can be modified, user-configurable, and/or omitted. In a first example method, the user inputs a power-on command to the television via the user input device 618 (transition 1426). The example television responds to the power-on command by powering on and sending a source message to the zone player. The zone player responds to the source message by selecting the television as the signal source and playing back audio information received from the television. In a second example method, the user inputs a source command to the zone player via the user input device 612 (transition 1440). The example zone player responds to the source command by sending a power-on message to the television (which in some embodiments receives the message from a low-power state rather than a completely powered-down state) and selecting the television as the audio information source. The television responds to the power-on message by changing to a powered-on state and transmitting audio information to the zone player (e.g., based on an input source).

While an example state diagram 1400 is described above, the state diagram 1400 can be modified to reflect different assumptions of user desires in behavior of the system. In some embodiments, the state diagram 1400 is modifiable by the user by changing settings and/or configurations of the audio playback device 602 and/or the audio information source 604. One such example setting is the setting 1430, which permits the user to configure how the television of the illustrated example is to respond to the transition 1428 from the states 1402, 1404.

In view of the foregoing, it should be apparent that disclosed example systems, methods, apparatus, and articles of manufacture can be used to control audio playback devices. Some example systems, methods, apparatus, and articles of manufacture advantageously allow for simpler control of an audio system, including an audio playback device and an audio information source, from the perspective of a user of the system. In some such examples, the user of the system can control the playback of audio using any of multiple user input devices that can be configured to communicate with different elements of the system. Some example systems, methods, apparatus, and articles of manufacture disclosed herein permit the user of an audio system including an audio playback device and an audio information source to control the audio volume and audio input source using a user input device that is configured to communicate with the audio information source but is not configured to communicate with the audio playback device.

Example systems, methods, apparatus, and articles of manufacture disclosed herein maintain a consistent volume when changing between different audio information sources, where one or more of the different audio information sources have independent and/or different volume settings.

Various inventions have been described in sufficient detail with a certain degree of particularity. It is understood to those skilled in the art that the present disclosure of embodiments has been made by way of examples only and that numerous changes in the arrangement and combination of parts can be resorted without departing from the spirit and scope of the present disclosure as claimed. While the embodiments discussed herein can appear to include some limitations as to the presentation of the information units, in terms of the format and arrangement, the embodiments have applicability well beyond such embodiment, which can be appreciated by those skilled in the art. Accordingly, the scope of the present disclosure is defined by the appended claims rather than the forgoing description of embodiments.

What is claimed is:

1. A first network device comprising:
a first network interface configured for communication via a first communication protocol;
a second network interface configured for communication via a second communication protocol;

at least one processor;
at least one tangible, non-transitory computer-readable medium; and
program instructions stored on the at least one tangible, non-transitory computer-readable medium that are executable by the at least one processor such that the first network device is configured to:
receive, via the first network interface from a third network device, one or more messages that cause the first network device to obtain media content and operate as part of a group with at least a second network device;
obtain media content and operate as part of the group with at least the second network device based on the one or more messages;
while operating as part of the group with at least the second network device and obtaining the media content, (i) transmit, via the second network interface, audio associated with the obtained media content to the second network device, and (ii) cause video associated with the obtained media content to be output while the second network device outputs audio associated with the obtained media content;
receive, via the second network interface, a first command to adjust a volume setting from a network device different than the first network device, the second network device, and the third network device;
based on the first command to adjust the volume setting, transmit a first volume adjustment command to the second network device;
receive, via the first network interface, a second command to adjust the volume setting from the third network device; and
based on the second command to adjust the volume setting, transmit a second volume adjustment command to the second network device.

2. The first network device of claim 1, wherein the first communication protocol comprises a Bluetooth protocol.

3. The first network device of claim 1, wherein the first communication protocol comprises a wireless infrared protocol.

4. The first network device of claim 1, wherein the second communication protocol comprises an IEEE 802.11 protocol.

5. The first network device of claim 1, wherein the second communication protocol comprises a wireless Local Area Network (LAN) protocol.

6. The first network device of claim 1, wherein the first communication protocol comprises a Bluetooth protocol, and wherein the second communication protocol comprises an IEEE 802.11 protocol.

7. The first network device of claim 1, wherein the third network device comprises a remote control.

8. The first network device of claim 1, wherein the third network device comprises a graphical user interface.

9. The first network device of claim 1, wherein the one or more messages from the third network device comprises information associated with an input selection command.

10. The first network device of claim 1, wherein the first network device is configured to communicate with the second network device via a packet-based network connection.

11. The first network device of claim 1, wherein the first network device is configured to (i) download one or more applications via an Internet connection, and (ii) store the downloaded one or more applications on the at least one tangible, non-transitory computer-readable medium.

12. The first network device of claim 1, further comprising a video screen, and wherein the program instructions executable by the at least one processor such that the first network device is configured to cause video associated with the obtained media content to be output while the second network device outputs audio associated with the obtained media content comprise program instructions executable by the at least one processor such that the first network device is configured to cause the video associated with the obtained media content to be output to the video screen.

13. The first network device of claim 1, wherein the program instructions comprise program instructions stored on the at least one tangible, non-transitory computer-readable medium that are executable by the at least one processor such that the first network device is configured to:

cause the second network device to output the audio associated with the obtained media content.

14. The first network device of claim 1, wherein the program instructions executable by the at least one processor such that the first network device is configured to cause video associated with the obtained media content to be output while the second network device outputs audio associated with the obtained media content comprise program instructions executable by the at least one processor such that the first network device is configured to cause video associated with the obtained media content to be output while the second network device and a fourth network device output the audio associated with the obtained media content.

15. The first network device of claim 14, wherein the program instructions executable by the at least one processor such that the first network device is configured to cause video associated with the obtained media content to be output while the second network device and a fourth network device output the audio associated with the obtained media content comprise program instructions executable by the at least one processor such that the first network device is configured to cause video associated with the obtained media content to be output while (i) the second network device outputs a first channel of the audio associated with the obtained media content and (ii) a fourth network device outputs a second channel of the audio associated with the obtained media content.

16. The first network device of claim 15, wherein the program instructions executable by the at least one processor such that the first network device is configured to cause video associated with the obtained media content to be output while (i) the second network device outputs a first channel of the audio associated with the obtained media content and (ii) a fourth network device outputs a second channel of the audio associated with the obtained media content comprise program instructions executable by the at least one processor such that the first network device is configured to cause video associated with the obtained media content to be output while (i) the second network device outputs the first channel of the audio associated with the obtained media content, (ii) the fourth network device outputs the second channel of the audio associated with the obtained media content, and (iii) a fifth network device outputs a third channel of the audio associated with the obtained media content.

17. The first network device of claim 1, wherein the one or more messages from the third network device comprises a command to play the media content.

18. The first network device of claim 1, wherein the first network device comprises an internet-enabled television.

19. Tangible, non-transitory computer-readable media comprising program instructions, wherein the program instructions, when executed by one or more processors, cause a first network device to perform functions comprising:

receiving, via a first network interface from a third network device, one or more messages that cause the first network device to obtain media content and operate as part of a group with at least a second network device, wherein the first network interface is configured for communication via a first communication protocol;

obtaining media content and operating as part of the group with at least the second network device based on the one or more messages;

while operating as part of the group with at least the second network device and obtaining the media content, (i) transmitting, via a second network interface, audio associated with the obtained media content to the second network device, wherein the second network interface is configured for communication via a second communication protocol, and (ii) causing video associated with the obtained media content to be output while the second network device outputs audio associated with the obtained media content;

receiving, via the second network interface, a first command to adjust a volume setting from a network device different than the first network device, the second network device, and the third network device;

based on the first command to adjust the volume setting, transmitting a first volume adjustment command to the second network device;

receiving, via the first network interface, a second command to adjust the volume setting from the third network device; and based on the second command to adjust the volume setting, transmitting a second volume adjustment command to the second network device.

20. The tangible, non-transitory computer-readable media of claim 19, wherein the first communication protocol comprises a Bluetooth protocol, and wherein the second communication protocol comprises an IEEE 802.11 protocol.

21. The tangible, non-transitory computer-readable media of claim 19, wherein the first communication protocol comprises a wireless infrared protocol, and wherein the second communication protocol comprises a wireless Local Area Network (LAN) protocol.

22. The tangible, non-transitory computer-readable media of claim 19, wherein causing video associated with the obtained media content to be output while the second network device outputs audio associated with the obtained media content comprises:

causing video associated with the obtained media content to be output while the second network device and a fourth network device output the audio associated with the obtained media content.

23. The tangible, non-transitory computer-readable media of claim 22, wherein causing video associated with the obtained media content to be output while the second network device and a fourth network device output the audio associated with the obtained media content comprises:

causing video associated with the obtained media content to be output while (i) the second network device outputs a first channel of the audio associated with the obtained media content and (ii) a fourth network device outputs a second channel of the audio associated with the obtained media content.

24. The tangible, non-transitory computer-readable media of claim 23, wherein causing video associated with the obtained media content to be output while (i) the second network device outputs a first channel of the audio associated with the obtained media content and (ii) a fourth network device outputs a second channel of the audio associated with the obtained media content comprises:

causing video associated with the obtained media content to be output while (i) the second network device outputs the first channel of the audio associated with the obtained media content, (ii) the fourth network device outputs the second channel of the audio associated with the obtained media content, and (iii) a fifth network device outputs a third channel of the audio associated with the obtained media content.

25. A system comprising a first network device and a second network device, wherein the first network device comprises:

a first network interface configured for communication via a first communication protocol;

a second network interface configured for communication via a second communication protocol;

at least one first processor;

at least one first tangible, non-transitory computer-readable medium; and first program instructions stored on the at least one first tangible, non-transitory computer-readable medium that are executable by the at least one first processor such that the first network device is configured to:

receive, via the first network interface from a third network device, one or more messages that cause the first network device to obtain media content and operate as part of a group with at least a second network device;

obtain media content and operate as part of the group with at least the second network device based on the one or more messages;

while operating as part of the group with at least the second network device and obtaining the media content, (i) transmit, via the second network interface, audio associated with the obtained media content to the second network device, and (ii) cause video associated with the obtained media content to be output while the second network device outputs audio associated with the obtained media content;

receive, via the second network interface, a first command to adjust a volume setting from a network device different than the first network device, the second network device, and the third network device;

based on the first command to adjust the volume setting, transmit a first volume adjustment command to the second network device;

receive, via the first network interface, a second command to adjust the volume setting from the third network device; and based on the second command to adjust the volume setting, transmit a second volume adjustment command to the second network device.

26. The system of claim 25, wherein the second network device comprises:

a third network interface configured for communication via the second communication protocol;

at least one second processor;

at least one second tangible, non-transitory computer-readable medium; and second program instructions stored on the at least one second tangible, non-transitory computer-readable medium that are executable by the at least one second processor such that the second network device is configured to:

operate as part of the group with at least the first network device; and after receiving, via the third network interface, audio associated with the obtained media content from the first network device while operating as part of the group with at least the first network device, cause the audio associated with the obtained media content to be output via one or more speakers while the first network device outputs video associated with the obtained media content.

27. A set of one or more processors configured for implementation within a first network device, wherein the set of one or more processors comprises tangible, non-transitory computer-readable media comprising program instructions that are executable by the set of one or more processors such that the first network device is configured to:

receive, via a first network interface from a third network device, one or more messages that cause the first network device to obtain media content and operate as part of a group with at least a second network device, wherein the first network interface is configured for communication via a first communication protocol;

obtain media content and operate as part of the group with at least the second network device based on the one or more messages;

while operating as part of the group with at least the second network device and obtaining the media content, (i) transmit, via a second network interface, audio associated with the obtained media content to the second network device, wherein the second network interface is configured for communication via a second communication protocol, and (ii) cause video associated with the obtained media content to be output while the second network device outputs audio associated with the obtained media content;

receive, via the second network interface, a first command to adjust a volume setting from a network device different than the first network device, the second network device, and the third network device;

based on the first command to adjust the volume setting, transmit a first volume adjustment command to the second network device;

receive, via the first network interface, a second command to adjust the volume setting from the third network device; and based on the second command to adjust the volume setting, transmit a second volume adjustment command to the second network device.

28. The set of one or more processors of claim 27, wherein:

at least one of (i) the first communication protocol comprises a Bluetooth protocol and the second communication protocol comprises an IEEE 802.11 protocol, or (ii) the first communication protocol comprises a wireless infrared protocol and the second communication protocol comprises a wireless Local Area Network (LAN) protocol; and the program instructions executable by the set of one or more processors such that the first network device is configured to cause video associated with the obtained media content to be output while the second network device outputs audio associated with the obtained media content comprise program instructions executable by the set of one or more processors such that the first network device is configured to at least one of:

(A) cause video associated with the obtained media content to be output while the second network device and a fourth network device output the audio associated with the obtained media content;

(B) cause video associated with the obtained media content to be output while (i) the second network device outputs a first channel of the audio associated with the obtained media content and (ii) a fourth network device outputs a second channel of the audio associated with the obtained media content; or (C) cause video associated with the obtained media content to be output while (i) the second network device outputs the first channel of the audio associated with the obtained media content, (ii) the fourth network device outputs the second channel of the audio associated with the obtained media content, and (iii) a fifth network device outputs a third channel of the audio associated with the obtained media content.

\* \* \* \* \*